United States Patent
Doglio

(10) Patent No.: US 10,978,940 B2
(45) Date of Patent: Apr. 13, 2021

(54) METHODS AND APPARATUS FOR DETERMINING HEALTH STATUS OF ELECTRIC ACTUATORS BASED ON TORQUE TREND DATA

(71) Applicant: Biffi Italia S.R.L., Fiorenzuola d'Arda (IT)

(72) Inventor: Carlo Doglio, Fiorenzuola d'Arda (IT)

(73) Assignee: BIFFI ITALIA S.R.L., Fiorenzuola d'Arda (IT)

( * ) Notice: Subject to any disclaimer, the term of this patent is extended or adjusted under 35 U.S.C. 154(b) by 0 days.

(21) Appl. No.: 16/027,014

(22) Filed: Jul. 3, 2018

(65) Prior Publication Data

US 2020/0007011 A1   Jan. 2, 2020

(30) Foreign Application Priority Data

Jun. 29, 2018   (IT) .................... 102018000006828

(51) Int. Cl.
*G01L 5/00* (2006.01)
*H02K 11/24* (2016.01)
(Continued)

(52) U.S. Cl.
CPC ............ *H02K 11/24* (2016.01); *G01L 5/0071* (2013.01); *G01R 31/343* (2013.01); *H02P 29/0241* (2016.02); *H02P 29/032* (2016.02)

(58) Field of Classification Search
CPC ...... F16K 37/0083; F16K 31/00; H02P 29/02; H02P 29/0241; H02P 29/032;
(Continued)

(56) References Cited

U.S. PATENT DOCUMENTS 7,539,549 B1   5/2009   Discenzo et al.
2003/0042861 A1   3/2003   Schwartz et al.
(Continued)

OTHER PUBLICATIONS

Biffi, "Biffi ICON 2000 Instruction and Operating Manual," Sep. 2017, 81 pages.
(Continued)

*Primary Examiner* — Eduardo Colon Santana
*Assistant Examiner* — Zemenay T Truneh
(74) *Attorney, Agent, or Firm* — Hanley, Flight & Zimmerman, LLC

(57) ABSTRACT

An example apparatus includes a controller operatively coupled to an electric actuator via a network. The controller is configured to obtain torque curve data over the network from the electric actuator, the torque curve data being associated with actuation of an electric motor of the electric actuator, the actuation to cause a flow control member of a motor-operated valve to move, the flow control member being mechanically coupled to the electric motor and being movable between an open position and a closed position. The controller is configured to determine an area under a torque curve based on the torque curve data, determine a variance between the area under the torque curve and an area under a reference curve, and generate a first control signal indicating that the electric actuator is healthy when it is determined that the variance does not exceed the variance threshold.

18 Claims, 9 Drawing Sheets

(51) Int. Cl.
*G01R 31/34* (2020.01)
*H02P 29/032* (2016.01)
*H02P 29/024* (2016.01)

(58) Field of Classification Search
CPC .... H02K 11/24; G01L 5/0071; G01R 31/343; G01M 13/021; F04B 49/06
USPC .... 73/862.53, 862.31; 318/400, 434, 490, 4; 700/28
See application file for complete search history.

(56) References Cited

U.S. PATENT DOCUMENTS

2009/0126511 A1* 5/2009 Nogami .............. G01M 13/021
 73/862.31
2013/0047745 A1 2/2013 Vidal
2018/0320943 A1* 11/2018 Schumacher ........... F04B 49/06

OTHER PUBLICATIONS

Biffi, "ICON 2000 Electric Actuators," Nov. 2016, 48 pages.
Biffi, "Biffi ICON 3000 Instruction and Operating Manual," Jun. 2018, 59 pages.
Italian Patent Office, "Search Report and Office Action," issued in connection with Italian Patent Application No. IT201800006828, dated Mar. 11, 2019, 11 pages.
International Searching Authority, "International Search Report and Written Opinion," issued in connection with International Patent Application No. PCT/IB2019/000820, dated Dec. 13, 2019, 14 pages.

* cited by examiner

METHODS AND APPARATUS FOR DETERMINING HEALTH STATUS OF ELECTRIC ACTUATORS BASED ON TORQUE TREND DATA

RELATED APPLICATIONS

This application claims priority to Italian Patent Application No. 102018000006828, filed Jun. 29, 2018, entitled "Methods and Apparatus for Determining Health Status of Electric Actuators Based on Torque Trend Data," the entirety of which is hereby incorporated herein by reference.

FIELD OF THE DISCLOSURE

This disclosure relates generally to process control systems including electric actuators and, more particularly, to methods and apparatus for determining health status of electric actuators based on torque trend data.

BACKGROUND

Motor-operated valves commonly include an electric actuator having an electric motor, and further include a flow control member (e.g., a disc, a ball, a plug, a piston, etc.) mechanically coupled (e.g., via a shaft) to the electric motor of the electric actuator. The electric motor can be actuated and/or commanded (e.g., via one or more electrical control signal(s)) to move (e.g., rotate, slide, etc.) the flow control member of the motor-operated valve between an open position and a closed position (e.g., an opening stroke, a closing stroke, etc.).

Some known electric actuators generate torque curve data in conjunction with the above-described actuation(s) and/or movement(s) of the electric motor and/or the flow control member. As used herein, the term "torque curve data" refers to data providing measured torque as a function of and/or correlated with measured position, with the measured torque corresponding to a torque of one of the electric motor, the shaft mechanically coupled to the electric motor, or the flow control member mechanically coupled to the shaft, and the measured position corresponding to a position of one of the electric motor, the shaft, or the flow control member. Torque curve data generated and/or stored by the electric actuator can be transferred to a computing device located remotely from the electric actuator for further analysis and/or post-processing.

Process control systems including such known electric actuators and computing devices typically analyze and/or post-process the torque curve data subsequent to the electric actuator becoming unhealthy, as can occur when one or more component(s) of the electric motor and/or, more generally, of the electric actuator fail(s), break(s), and/or otherwise cease(s) to operate or function according to its/their intended purpose.

SUMMARY

Example methods and apparatus for determining health status of electric actuators based on torque trend data are disclosed. In some examples, an apparatus for determining a health status of an electric actuator of a motor-operated valve is disclosed. In some disclosed examples, the apparatus comprises a controller operatively coupled to the electric actuator via a network. In some disclosed examples, the controller is configured to obtain torque curve data over the network from the electric actuator. In some disclosed examples, the torque curve data is associated with actuation of an electric motor of the electric actuator. In some disclosed examples, the actuation is to cause a flow control member of the motor-operated valve to move. In some disclosed examples, the flow control member is mechanically coupled to the electric motor and is movable between an open position and a closed position. In some disclosed examples, the controller is further configured to determine an area under a torque curve based on the torque curve data. In some disclosed examples, the controller is further configured to determine a variance between the area under the torque curve and an area under a reference curve. In some disclosed examples, the controller is further configured to determine whether the variance exceeds a variance threshold. In some disclosed examples, the controller is further configured to generate a first control signal indicating that the electric actuator is healthy when it is determined that the variance does not exceed the variance threshold.

In some examples, a method for determining a health status of an electric actuator of a motor-operated valve is disclosed. In some disclosed examples, the method comprises obtaining, by executing one or more instructions with a controller operatively coupled to the electric actuator via a network, torque curve data over the network from the electric actuator. In some disclosed examples, the torque curve data is associated with actuation of an electric motor of the electric actuator. In some disclosed examples, the actuation is to cause a flow control member of the motor-operated valve to move. In some disclosed examples, the flow control member is mechanically coupled to the electric motor and is movable between an open position and a closed position. In some disclosed examples, the method further comprises determining, by executing one or more instructions with the controller, an area under a torque curve based on the torque curve data. In some disclosed examples, the method further comprises determining, by executing one or more instructions with the controller, a variance between the area under the torque curve and an area under a reference curve. In some disclosed examples, the method further comprises determining, by executing one or more instructions with the controller, whether the variance exceeds a variance threshold. In some disclosed examples, the method further comprises generating a first control signal indicating that the electric actuator is healthy when it is determined that the variance does not exceed the variance threshold.

In some examples, a non-transitory computer-readable storage medium comprising instructions is disclosed. In some disclosed examples, the instructions, when executed, cause a controller to obtain torque curve data over a network from an electric actuator operatively coupled to the controller via the network. In some disclosed examples, the torque curve data is associated with actuation of an electric motor of the electric actuator. In some disclosed examples, the actuation is to cause a flow control member of the motor-operated valve to move. In some disclosed examples, the flow control member is mechanically coupled to the electric motor and is movable between an open position and a closed position. In some disclosed examples, the instructions, when executed, further cause the controller to determine an area under a torque curve based on the torque curve data. In some disclosed examples, the instructions, when executed, further cause the controller to determine a variance between the area under the torque curve and an area under a reference curve. In some disclosed examples, the instructions, when executed, further cause the controller to determine whether the variance exceeds a variance threshold. In some disclosed examples, the instructions, when executed, further cause the controller to generate a first control signal indicating that the electric actuator is healthy when it is determined that the variance does not exceed the variance threshold.

Certain examples are shown in the above-identified figures and described in detail below. In describing these examples, like or identical reference numbers are used to identify the same or similar elements. The figures are not necessarily to scale and certain features and certain views of the figures may be shown exaggerated in scale or in schematic for clarity and/or conciseness.

DETAILED DESCRIPTION

Unlike the known process control systems described above in which the analysis and/or post-processing of the torque curve data obtained from the electric actuator is performed subsequent to the electric actuator becoming unhealthy, the methods and apparatus disclosed herein advantageously analyze and/or post-process the torque curve data prior to the electric actuator becoming unhealthy. The disclosed methods and apparatus advantageously generate and present notification(s), message(s) and/or alert(s) indicating and/or identifying a current (e.g., real-time or near real-time) health status (e.g., healthy, functional, unhealthy, non-functional, etc.) of the electric actuator. In some examples, the disclosed methods and apparatus base the generation and/or presentation of such notification(s), message(s) and/or alert(s) on an analysis of torque trend data generated in relation to one or more torque curve(s) included in the torque curve data, as well as a reference torque curve.

As a result of identifying the health status of the electric actuator prior to, at, and/or just after the time at which the electric actuator begins to show signs of becoming unhealthy, the disclosed methods and apparatus advantageously provide for advanced, real-time, and/or near real-time notification and/or warning of an actual or impending failure of the electric actuator. Such notification(s) and/or warning(s) advantageously enable the electric actuator to be serviced, removed from service, and/or replaced at a time which is substantially earlier than would otherwise be the case in connection with the known process control systems described above.

Figure 1:
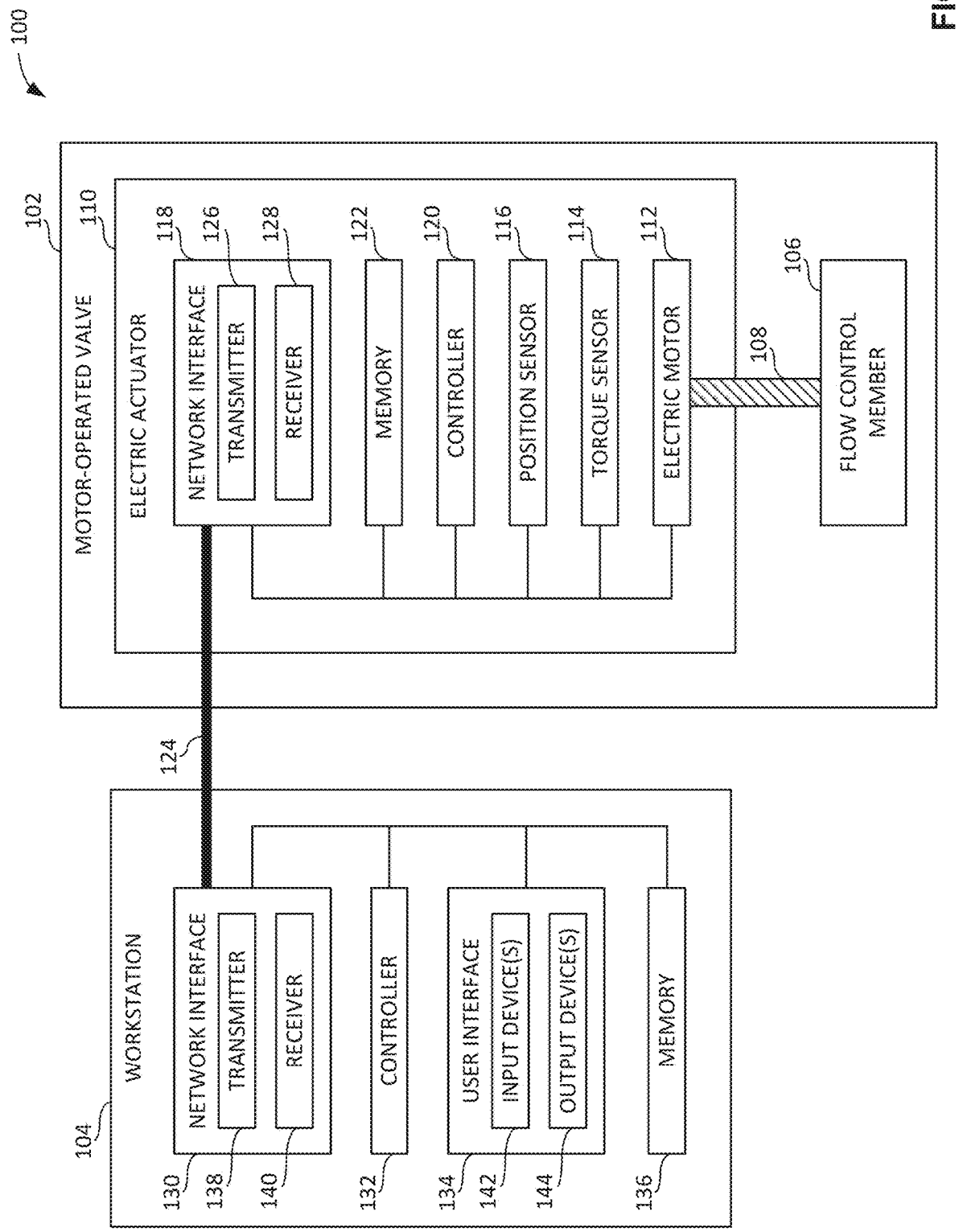
FIG. 1 is a block diagram of an example process control system including an example motor-operated valve and an example workstation constructed in accordance with the teachings of this disclosure.

FIG. 1 is a block diagram of an example process control system 100 including an example motor-operated valve 102 and an example workstation 104 constructed in accordance with the teachings of this disclosure. The motor-operated valve 102 of FIG. 1 includes an example flow control member 106, an example shaft 108 operatively coupled (e.g., mechanically coupled) to the flow control member 106, and an example electric actuator 110 operatively coupled (e.g., in mechanically coupled) to the shaft 108. The electric actuator 110 produces torque to actuate, move, and/or operate the shaft 108 and/or the flow control member 106 of the motor-operated valve 102 of FIG. 1. In some examples, the operation and/or actuation of the electric actuator 110 of FIG. 1 is controlled, managed, and/or monitored via the workstation 104 of FIG. 1, as further described below.

The motor-operated valve 102 of FIG. 1 can be implemented as any type of motor-driven and/or motor-actuated valve. For example, the motor-operated valve 102 can be a motor-driven and/or motor-operated rotary valve. In such an example, the shaft 108 can be a rotating shaft, and the flow control member 106 can be a disc, a ball, or some other rotatable member that can be actuated and/or moved (e.g., rotated) between an open position and a closed position (e.g., an opening stroke, a closing stroke, etc.). In such an example, a force and/or load generated via the electric actuator 110 of FIG. 1 causes the shaft 108 to rotate, which in turn causes the flow control member 106 to rotate between the open position and the closed position.

As another example, the motor-operated valve 102 can be a motor-driven and/or motor-operated sliding stem valve. In such an example, the shaft 108 can be a slidable stem, and the flow control member 106 can be a plug, a piston, or some other slidable member that can be actuated and/or moved (e.g., translated) between an open position and a closed position (e.g., an opening stroke, a closing stroke, etc.). In such an example, a force and/or load generated via the electric actuator 110 of FIG. 1 causes the shaft 108 to translate and/or slide, which in turn causes the flow control member 106 to translate and/or slide between the open position and the closed position.

The shaft 108 of the motor-operated valve 102 of FIG. 1 can be implemented via a single shaft, or via multiple shafts that are operatively coupled (e.g., mechanically coupled) to one another. In some examples, a first end of the shaft 108 is mechanically coupled to the flow control member 106 of the motor-operated valve 102, and a second end of the shaft 108 opposite the first end is mechanically coupled to the electric actuator 110 of the motor-operated valve 102. The operative coupling of the shaft 108 to the flow control member 106 and the electric actuator 110 results in a correlation between the position of the electric actuator 110, the position of the shaft 108, and the position of the flow control member 106. Accordingly, a position of the flow control member 106 of the motor-operated valve 102 can be determined based on a known and/or measured position of the shaft 108 or the electric actuator 110 of the motor-operated valve 102 of FIG. 1, and vice-versa.

In the illustrated example of FIG. 1, the electric actuator 110 includes an example electric motor 112, an example torque sensor 114, an example position sensor 116, an example network interface 118, an example controller 120, and an example memory 122. The electric motor 112, the torque sensor 114, the position sensor 116, the network interface 118, the controller 120, and/or the memory 122 of the electric actuator 110 of FIG. 1 are operatively coupled to (e.g., in electrical communication with) one another. The electric motor 112 of the electric actuator 110 of FIG. 1 is operatively coupled to (e.g., in mechanical communication with) the shaft 108 of the motor-operated valve 102 of FIG. 1.

The electric motor 112 of the electric actuator 110 of FIG. 1 is an electrically-powered device structured to convert electrical energy into mechanical energy. More specifically, the electric motor 112 of FIG. 1 is structured to convert one or more electrical control signal(s) received at the electric motor 112 (e.g., from the controller 120 of FIG. 1, etc.) into an output torque. Based on the mechanical coupling of the electric motor 112 of FIG. 1 to the shaft 108 of the motor-operated valve 102 of FIG. 1, and further based on the mechanical coupling of the shaft 108 to the flow control member 106 of the motor-operated valve 102 of FIG. 1, the output torque generated by the electric motor 112 of FIG. 1 is applied to the shaft 108 and/or the flow control member 106 of the motor-operated valve 102 to actuate, move, and/or operate the shaft 108 and/or the flow control member 106. The electric motor 112 of FIG. 1 can be implemented as a direct current (DC) electric motor or, alternatively, as an alternating current (AC) electric motor.

The torque sensor 114 of the electric actuator 110 of FIG. 1 senses and/or detects the torque of the electric motor 112 of FIG. 1 as the electric motor 112 actuates and/or moves the shaft 108 and/or the flow control member 106 of FIG. 1 between an open position and a closed position (e.g., an opening stroke, a closing stroke, etc.). The torque sensor 114 of FIG. 1 is located, mounted on, and/or otherwise structurally coupled to the electric motor 112 and/or the shaft 108 of FIG. 1, and is operatively coupled to (e.g., in electrical communication with) the controller 120 and/or the memory 122 of the electric actuator 110 of FIG. 1. Torque data sensed and/or detected by the torque sensor 114 of FIG. 1 can be of any type, form and/or format, and can be stored in a non-transitory computer-readable storage medium such as the memory 122 of FIG. 1 described below.

In some examples, the torque sensor 114 of FIG. 1 can be implemented by the combination of a speed sensor that senses and/or detects the speed of the electric motor 112 of FIG. 1, and a current sensor that senses and/or detects the current of the electric motor 112 of FIG. 1. In such examples, the controller 120 of the electric actuator 110 of FIG. 1 may determine and/or calculate torque data based on speed data sensed and/or detected by the speed sensor and further based on current data sensed and/or detected by the current sensor.

Torque data sensed and/or detected by the torque sensor 114 of FIG. 1, or determined by the controller 120 of FIG. 1, can be accessed by the network interface 118 and/or the controller 120 of the electric actuator 110 of FIG. 1 either from the memory 122 or directly from the torque sensor 114 of FIG. 1. In some examples, the torque sensor 114 of FIG. 1 can constantly sense and/or constantly detect the torque data. In other examples, the torque sensor 114 of FIG. 1 can periodically sense and/or periodically detect the torque data based on a timing interval and/or a sampling frequency implemented via the controller 120 of FIG. 1. For example, the controller 120 of FIG. 1 can impose a sampling frequency for the torque sensor 114 of FIG. 1 that instructs and/or causes the torque sensor 114 to sense and/or detect the torque of the electric motor 112, the shaft 108, and/or the flow control member 106 of FIG. 1 at an interval corresponding to each one percent (1%) of travel of the shaft 108 and/or the flow control member 106 from the open position to the closed position (e.g., 0% closed to 100% closed), or from the closed position to the open position (e.g., 0% open to 100% open). As another example, the controller 120 of FIG. 1 can impose a sampling frequency for the torque sensor 114 of FIG. 1 that instructs and/or causes the torque sensor 114 to sense and/or detect the torque of the electric motor 112, the shaft 108, and/or the flow control member 106 of FIG. 1 at a specified timing interval (e.g., every one-hundred milliseconds, every five-hundred milliseconds, etc.) as the shaft 108 and/or the flow control member 106 travel(s) from the open position to the closed position (e.g., 0% closed to 100% closed), or from the closed position to the open position (e.g., 0% open to 100% open).

The position sensor 116 of the electric actuator 110 of FIG. 1 senses and/or detects the position of the electric motor 112, the shaft 108, and/or the flow control member 106 of FIG. 1 as the electric motor 112 actuates and/or moves the shaft 108 and/or the flow control member 106 of FIG. 1 between an open position and a closed position (e.g., an opening stroke, a closing stroke, etc.). The position sensor 116 of FIG. 1 is located, mounted on, and/or otherwise structurally coupled to the electric motor 112 and/or the shaft 108 of FIG. 1, and is operatively coupled to (e.g., in electrical communication with) the controller 120 and/or the memory 122 of the electric actuator 110 of FIG. 1.

Position data sensed and/or detected by the position sensor 116 of FIG. 1 can be of any type, form and/or format, and can be stored in a non-transitory computer-readable storage medium such as the memory 122 of FIG. 1 described below. Position data sensed and/or detected by the position sensor 116 of FIG. 1 can be accessed by the network interface 118 and/or the controller 120 of the electric actuator 110 of FIG. 1 either from the memory 122 or directly from the position sensor 116 of FIG. 1. In some examples, the position sensor 116 of FIG. 1 can constantly sense and/or constantly detect the position data. In other examples, the position sensor 116 of FIG. 1 can periodically sense and/or periodically detect the position data based on a timing interval and/or a sampling frequency implemented via the controller 120 of FIG. 1. For example, the controller 120 of FIG. 1 can impose a sampling frequency for the position sensor 116 of FIG. 1 that instructs and/or causes the position sensor 116 to sense and/or detect the position of the electric motor 112, the shaft 108, and/or the flow control member 106 of FIG. 1 at an interval corresponding to each one percent (1%) of travel of the shaft 108 and/or the flow control member 106 from the open position to the closed position (e.g., 0% closed to 100% closed), or from the closed position to the open position (e.g., 0% open to 100% open). As another example, the controller 120 of FIG. 1 can impose a sampling frequency for the position sensor 116 of FIG. 1 that instructs and/or causes the position sensor 116 to sense and/or detect the position of the electric motor 112, the shaft 108, and/or the flow control member 106 of FIG. 1 at a specified timing interval (e.g., every one-hundred milliseconds, every five-hundred milliseconds, etc.) as the shaft 108 and/or the flow control member 106 travel(s) from the open position to the closed position (e.g., 0% closed to 100% closed), or from the closed position to the open position (e.g., 0% open to 100% open).

The network interface 118 of the electric actuator 110 of FIG. 1 facilitates the exchange of data with one or more networked device(s) (e.g., the workstation 104 of FIG. 1) via an example network 124 of FIG. 1. In some examples, the network 124 of FIG. 1 can be implemented via 4-20 mA wiring, and/or via one or more communication protocol(s) including, for example, Foundation Fieldbus, Highway Addressable Remote Transducer (HART), Transmission Control Protocol/Internet Protocol (TCP/IP), Profinet, Modbus, and/or Ethernet. In other examples, the network 124 can be implemented via a wireless local area network (WLAN) or via a cellular network using one or more communication protocol(s) including, for example, Long Term Evolution (LTE), Wi-Fi, and/or Bluetooth.

In the illustrated example of FIG. 1, the network interface 118 includes an example transmitter 126 and an example receiver 128. In some examples, the transmitter 126 and the receiver 128 of the network interface 118 of the electric actuator 110 of FIG. 1 can respectively be in wired communication with the workstation 104 of FIG. 1. In other examples, the transmitter 126 and the receiver 128 of the network interface 118 of the electric actuator 110 of FIG. 1 can respectively wirelessly communicate with the workstation 104 of FIG. 1. In such other examples, the transmitter 126 can be implemented via a radio transmitter, and the receiver 128 can be implemented as a radio receiver.

The transmitter 126 of the network interface 118 of FIG. 1 transmits data via one or more electrical signal(s) to one or more networked device(s) (e.g., the workstation 104 of FIG. 1). The data and/or signal(s) transmitted by the transmitter 126 of FIG. 1 is/are communicated over the network 124 of FIG. 1 described above. In some examples, the data and/or signal(s) transmitted by the transmitter 126 of FIG. 1 can include torque data detected by the torque sensor 114, position data detected by the position sensor 116, and/or torque curve data determined and/or generated by the controller 120 of the electric actuator 110 of FIG. 1, as further described below. Data corresponding to the signal(s) to be transmitted by the transmitter 126 of FIG. 1 can be of any type, form and/or format, and can be stored in a non-transitory computer-readable storage medium such as the memory 122 of FIG. 1 described below.

The receiver 128 of the network interface 118 of FIG. 1 collects, acquires and/or receives data and/or one or more electrical signal(s) from one or more networked device(s) (e.g., the workstation 104 of FIG. 1). The data and/or signal(s) received by the receiver 128 of FIG. 1 is/are communicated over the network 124 of FIG. 1 described above. In some examples, the data and/or signal(s) received by the receiver 128 of FIG. 1 can include information request(s) and/or control signal(s) generated by the workstation 104 of FIG. 1, as further described below. Data carried by, identified and/or derived from the signal(s) collected and/or received by the receiver 128 of FIG. 1 can be of any type, form and/or format, and can be stored in a non-transitory computer-readable storage medium such as the memory 122 of FIG. 1 described below.

The controller 120 of the electric actuator 110 of FIG. 1 is structured to control and/or manage the operation of the electric motor 112, the torque sensor 114, the position sensor 116, the network interface 118 and/or, more generally, the electric actuator 110 of FIG. 1. The controller 120 of the electric actuator 110 can be implemented as a programmable logic controller (PLC) configured to execute one or more computer and/or machine-readable instructions.

The controller 120 of FIG. 1 generates one or more control signal(s), instructions(s) and/or command(s) to actuate the electric motor 112 of the electric actuator 110 of FIG. 1 from the open position to the closed position (e.g., 0% closed to 100% closed), or from the closed position to the open position (e.g., 0% open to 100% open). In some examples, the one or more control signal(s), instruction(s) and/or command(s) generated by the controller 120 to actuate the electric motor 112 can correspond to and/or be derived from one or more control signal(s), instruction(s) and/or command(s) received at the receiver 128 of the network interface 118 of the electric actuator 110 of FIG. 1 from the workstation 104 of FIG. 1. In conjunction with (e.g., at or near the same time as) generating the control signal(s), instruction(s) and/or command(s) to actuate the electric motor 112, the controller 120 of FIG. 1 can also instruct and/or command the torque sensor 114 and/or the position sensor 116 of the electric actuator 110 of FIG. 1 to detect, sense and/or measure torque data and/or position data associated with the actuation of the electric motor 112. For example, the controller 120 can instruct and/or command the torque sensor 114 and/or the position sensor 116 to commence detecting, sensing and/or measuring torque data and/or position data prior to the initiation of the actuation of the electric motor 112, and can further instruct and/or command the torque sensor 114 and/or the position sensor 116 to cease detecting, sensing and/or measuring torque data and/or position data subsequent to the completion of the actuation of the electric motor 112.

The controller 120 of FIG. 1 correlates and/or synchronizes the detected torque data with the detected position data. For example, the controller 120 can correlate and/or synchronize the detected torque data with the detected position data by matching time stamps associated with the detected torque data to corresponding time stamps associated with the detected position data. In some examples, the detected torque data can be correlated and/or synchronized with the detected position data based on the respective sampling frequencies implemented by the torque sensor 114 and the position sensor 116, as controlled and/or managed via the controller 120. For example, the controller 120 of FIG. 1 can impose sampling frequencies on the torque sensor 114 and the position sensor 116 of FIG. 1 that instruct and/or cause the torque sensor 114 and the position sensor 116 to sense and/or detect the torque of the electric motor 112, the shaft 108, and/or the flow control member 106 of FIG. 1 at an interval corresponding to each one percent (1%) of travel of the shaft 108 and/or the flow control member 106 from the open position to the closed position (e.g., 0% closed to 100% closed), or from the closed position to the open position (e.g., 0% open to 100% open). In such an example, the resultant torque and position data produces one hundred one (101) correlated and/or synchronized data elements (e.g., a torque of "T(0)" at a position of 0%, a torque of "T(1)" at a position of 1%, ... a torque of "T(100)" at a position of 100%) associated with the actuation of the electric motor 112 of FIG. 1 to open or close the flow control member 106 of the motor-operated valve 102 of FIG. 1. As another example, the controller 120 of FIG. 1 can impose sampling frequencies on the torque sensor 114 and the position sensor 116 of FIG. 1 that instruct and/or cause the torque sensor 114 and the position sensor 116 to sense and/or detect the torque of the electric motor 112, the shaft 108, and/or the flow control member 106 of FIG. 1 at a specified timing interval (e.g., every one-hundred milliseconds, every five-hundred milliseconds, etc.) as the shaft 108 and/or the flow control member 106 travel(s) from the open position to the closed position (e.g., 0% closed to 100% closed), or from the closed position to the open position (e.g., 0% open to 100% open)

The controller 120 of FIG. 1 generates torque curve data (e.g., one or more torque curves) including and/or based on the correlated and/or synchronized torque and position data. In some examples, the controller 120 of FIG. 1 can organize, partition and/or segment the torque curve data into one or more opening torque curve(s) associated with the electric motor 112, the shaft 108, and/or the flow control member 106 of the motor-operated valve 102 of FIG. 1 being actuated from the closed position to the open position (e.g., 0% open to 100% open), and one or more closing torque curve(s) associated with the electric motor 112, the shaft 108, and/or the flow control member 106 of the motor-operated valve 102 of FIG. 1 being actuated from open position to the closed position (e.g., 0% closed to 100% closed).

Torque curve data generated by the controller 120 of FIG. 1 can be of any type, form and/or format, and can be stored in a non-transitory computer-readable storage medium such as the memory 122 of FIG. 1 described below. In some examples, torque curve data corresponding to separate instances and/or occurrences of the electric motor 112, the shaft 108 and/or the flow control member 106 of the motor-operated valve 102 of FIG. 1 being actuated can be stored in the memory 122. For example, the memory 122 can have a storage capacity that enables the memory 122 to store torque curve data for one hundred separate instances and/or occurrences of the electric motor 112, the shaft 108 and/or the flow control member 106 of the motor-operated valve 102 of FIG. 1 being actuated. Torque curve data generated by the controller 120 of FIG. 1 and stored in the memory 122 of FIG. 1 can be accessed by the network interface 118 and/or the controller 120 of the electric actuator 110 of FIG. 1 from the memory 122.

The controller 120 of FIG. 1 determines whether and/or when the torque curve data generated by the controller 120 and/or stored in the memory 122 of the electric actuator 110 of FIG. 1 is to be transmitted from the electric actuator 110 of the motor-operated valve 102 of FIG. 1 to the workstation 104 of FIG. 1. The controller 120 can determine that the torque curve data is to be transmitted based on the satisfaction or dissatisfaction of one or more condition(s) and/or state(s) of the electric actuator 110 being monitored by the controller 120. For example, the controller 120 of FIG. 1 can monitor the memory 122 of the electric actuator 110 of FIG. 1 for the introduction of new and/or updated torque curve data. In such an example, the controller 120 can determine that the new and/or updated torque curve data stored in the memory 122 is to be transmitted from the electric actuator 110 to the workstation 104 upon the new and/or updated torque curve data being identified by the controller 120.

As another example, the controller 120 of FIG. 1 can monitor the status of a timer corresponding to a time and/or a period of time (e.g., every minute, every hour, every twelve hours, every twenty four hours, etc.) at which the torque curve data stored in the memory 122 is to be transmitted. In such an example, the controller 120 can determine that the torque curve data stored in the memory 122 is to be transmitted from the electric actuator 110 to the workstation 104 in response to the controller 120 determining that the timer indicates an arrival of the time and/or an expiration of the time period.

As another example, the controller 120 of FIG. 1 can monitor a remaining storage capacity associated with the memory 122, and can determine whether the remaining storage capacity of the memory 122 falls below and/or fails to exceed a remaining storage capacity threshold. In such an example, the controller 120 can determine that the torque curve data stored in the memory 122 is to be transmitted from the electric actuator 110 to the workstation 104 in response to the controller 120 determining that the remaining storage capacity of the memory 122 falls below and/or fails to exceed the remaining storage capacity threshold.

As another example, the controller 120 of FIG. 1 can monitor the network interface 118 and/or the memory 122 of the electric actuator 110 of FIG. 1 for the arrival of one or more information request(s) at the electric actuator 110 from the workstation 104 of FIG. 1. In such an example, the controller 120 can determine that the torque curve data stored in the memory 122 is to be transmitted from the electric actuator 110 to the workstation 104 in response to the controller 120 identifying the information request(s).

In response to determining that the torque curve data is to be transmitted from the electric actuator 110 of the motor-operated valve 102 of FIG. 1 to the workstation 104 of FIG. 1, the controller 120 of FIG. 1 generates one or more control signal(s), instruction(s) and/or command(s) directing the transmitter 126 of the network interface 118 to transmit the torque curve data to the workstation 104. The transmitted torque curve data can be processed by the workstation 104 to determine a health status of the electric actuator 110, as further described below.

In other examples, one or more of the above-described correlation and/or generation operation(s) of the controller 120 of the electric actuator 110 of FIG. 1 can alternatively be performed at and/or by the workstation 104 of FIG. 1 to reduce the processing load and/or burden of the electric actuator 110. In such other examples, the controller 120 of the electric actuator 110 of FIG. 1 can conduct the above-described monitoring operation(s) relative to the torque data and the position data instead of relative to the torque curve data. In such other examples, in response to determining that the torque data and the position data are to be transmitted from the electric actuator 110 of the motor-operated valve 102 of FIG. 1 to the workstation 104 of FIG. 1, the controller 120 of FIG. 1 generates one or more control signal(s), instruction(s) and/or command(s) directing the transmitter 126 of the network interface 118 to transmit the torque data and position data to the workstation 104.

The memory 122 of the electric actuator 110 of FIG. 1 can be implemented by any type(s) and/or any number(s) of storage device(s) such as a storage drive, a flash memory, a read-only memory (ROM), a random-access memory (RAM), a cache and/or any other storage medium in which information is stored for any duration (e.g., for extended time periods, permanently, brief instances, for temporarily buffering, and/or for caching of the information). The information stored in the memory 122 can be stored in any file and/or data structure format, organization scheme, and/or arrangement.

Data and/or information collected and/or received by the torque sensor 114, the position sensor 116, the receiver 128 of the network interface 118, and/or the controller 120 of the electric actuator 110 of FIG. 1 can be stored in the memory 122 of the electric actuator 110 of FIG. 1. Data and/or information corresponding to any of the above-described torque data, position data, torque curve data, information request(s), control signal(s), instruction(s) and/or command(s) can be stored in the memory 122. Data and/or information stored in the memory 122 is accessible to the network interface 118 and/or the controller 120 of the electric actuator 110 of FIG. 1. In some examples, data and/or information stored in the memory 122 of the electric actuator 110 of FIG. 1 can be transmitted over the network 124 of FIG. 1 from the electric actuator 110 to the workstation 104 of FIG. 1 via the transmitter 126 of the network interface 118 of FIG. 1.

In the illustrated example of FIG. 1, the workstation 104 includes an example network interface 130, an example controller 132, an example user interface 134, and an example memory 136. The network interface 130, the controller 132, the user interface 134, and/or the memory 136 of the workstation 104 of FIG. 1 are operatively coupled to (e.g., in electrical communication with) one another. The network interface 130 of the workstation 104 of FIG. 1 is communicatively coupled to the network interface 118 of the electric actuator 110 of FIG. 1 via the network 124 described above.

The network interface 130 of the workstation 104 of FIG. 1 facilitates the exchange of data with one or more networked device(s) (e.g., the electric actuator 110 of FIG. 1) via the network 124 of FIG. 1. In the illustrated example of FIG. 1, the network interface 130 includes an example transmitter 138 and an example receiver 140. In some examples, the transmitter 138 and the receiver 140 of the network interface 130 of the workstation 104 of FIG. 1 can respectively be in wired communication with the electric actuator 110 of FIG. 1. In other examples, the transmitter 138 and the receiver 140 of the network interface 130 of the workstation 104 of FIG. 1 can respectively wirelessly communicate with the electric actuator 110 of FIG. 1. In such other examples, the transmitter 138 can be implemented via a radio transmitter, and the receiver 140 can be implemented as a radio receiver.

The transmitter 138 of the network interface 130 of FIG. 1 transmits data via one or more electrical signal(s) to one or more networked device(s) (e.g., the electric actuator 110 of FIG. 1). The data and/or signal(s) transmitted by the transmitter 138 of FIG. 1 is/are communicated over the network 124 of FIG. 1 described above. In some examples, the data and/or signal(s) transmitted by the transmitter 138 of FIG. 1 can include information request(s) and/or control signal(s) generated by the controller 132 of the workstation 104 of FIG. 1, as further described below. Data corresponding to the signal(s) to be transmitted by the transmitter 138 of FIG. 1 can be of any type, form and/or format, and can be stored in a non-transitory computer-readable storage medium such as the memory 136 of FIG. 1 described below.

The receiver 140 of the network interface 130 of FIG. 1 collects, acquires and/or receives data and/or one or more electrical signal(s) from one or more networked device(s) (e.g., the electric actuator 110 of FIG. 1). The data and/or signal(s) received by the receiver 140 of FIG. 1 is/are communicated over the network 124 of FIG. 1 described above. In some examples, the data and/or signal(s) received by the receiver 140 of FIG. 1 can include torque data detected by the torque sensor 114, position data detected by the position sensor 116, and/or torque curve data determined and/or generated by the controller 120 of the electric actuator 110 of FIG. 1, as described above. Data carried by, identified and/or derived from the signal(s) collected and/or received by the receiver 140 of FIG. 1 can be of any type, form and/or format, and can be stored in a non-transitory computer-readable storage medium such as the memory 136 of FIG. 1 described below.

The controller 132 of the workstation 104 of FIG. 1 is structured to control and/or manage the operation of the network interface 130, the user interface 134 and/or, more generally, the workstation 104 of FIG. 1. The controller 132 of the workstation 104 is further structured to initiate certain operations of the electric actuator 110 of FIG. 1. For example, the controller 132 of FIG. 1 can generate one or more control signal(s), instructions(s) and/or command(s) to cause an actuation of the electric motor 112 of the electric actuator 110 of FIG. 1. In such examples, the controller 132 can instruct and/or command the transmitter 138 of network interface 130 of FIG. 1 to transmit the electric motor actuation control signal(s), instruction(s) and/or command(s) from the workstation 104 of FIG. 1 to the electric actuator 110 of FIG. 1. The controller 132 of the workstation 104 can be implemented as a programmable logic controller (PLC) configured to execute one or more computer and/or machine-readable instructions.

The controller 132 and/or, more generally, the workstation 104 of FIG. 1 obtains torque curve data from the electric actuator 110 of FIG. 1. In some examples, the controller 132 of FIG. 1 generates one or more control signal(s), instructions(s) and/or command(s) structured as information request(s) that cause the workstation 104 to obtain torque curve data from the electric actuator 110 of FIG. 1. For example, the controller 132 can instruct and/or command the transmitter 138 of the network interface 130 of FIG. 1 to transmit the information request control signal(s), instruction(s) and/or command(s) from the workstation 104 of FIG. 1 to the electric actuator 110 of FIG. 1. In response to the transmission of such information request(s) and the receipt thereof at the electric actuator 110, the electric actuator 110 transmits the torque curve data stored in the memory 122 from the electric actuator 110 to the workstation 104, as described above. In other examples, the controller 132 and/or, more generally, the workstation 104 of FIG. 1 can alternatively obtain torque curve data from the electric actuator 110 by way of a data push operation initiated by the electric actuator 110, where the data push operation occurs without the controller 132 generating an information request for the torque curve data. Torque curve data obtained by the controller 132 and/or, more generally, the workstation 104 can be stored in a non-transitory computer-readable storage medium such as the memory 136 of FIG. 1 described below.

In some examples, the controller 132 of the workstation 104 of FIG. 1 can obtain torque curve data from the electric actuator 110 of FIG. 1 via the above-described information request(s) according to a time-based schedule managed and/or monitored by the controller 132. For example, the controller 132 can implement or manage a time-based schedule that causes the controller 132 to obtain torque curve data from the electric actuator 110 via the above-described information request(s) on a predetermined periodic basis (e.g., every minute, every hour, every twelve hours, every twenty four hours, etc.).

In other examples, the controller 132 of the workstation 104 of FIG. 1 can obtain torque curve data from the electric actuator 110 of FIG. 1 via the above-described information request(s) according to an actuation-based schedule managed and/or monitored by the controller 132. For example, the controller 132 can implement or manage an actuation-based schedule that causes the controller 132 to obtain torque curve data from the electric actuator 110 via the above-described information request(s) based on the controller 132 having commanded the actuation of the electric motor 112 of the electric actuator 110 a predetermined number of times (e.g. one time, two times, ten times, one hundred times) subsequent to the prior instance at which the controller 132 obtained torque curve data from the electric actuator 110.

In still other examples, the controller 132 of the workstation 104 of FIG. 1 can alternatively obtain torque curve data from the electric actuator 110 of FIG. 1 via the above-described information request(s) in response to one or more input(s) received by the controller 132 from the user interface 134 of the workstation 104 of FIG. 1. For example, the user interface 134 can receive an input and/or command from an end user that instructs and/or causes the controller 132 of the workstation 104 to obtain torque curve data from the electric actuator 110.

The controller 132 of the workstation 104 of FIG. 1 determines and/or calculates an area under the torque curve for each torque curve (e.g., each opening torque curve and each closing torque curve) included in the obtained torque curve data. For example, the controller 132 can determine and/or calculate an area under a torque curve (e.g., either an opening torque curve or a closing torque curve) according to the following equation when the torque curve includes one hundred one (101) data elements representing each one percent (1%) of movement of the flow control member 106 of the motor-operated valve 102 of FIG. 1 from the open position to the closed position (e.g., 0% closed to 100% closed), or from the closed position to the open position (e.g., 0% open to 100% open):

$$\text{Area}(n) = \sum_{i=0}^{100} T(i) \qquad \text{Equation 1}$$

where "n" is a numerical identifier of the torque curve, and "T(i)" is the detected torque (T) as a function of the detected position (i). As another example, the controller 132 can alternatively determine and/or calculate an area under a torque curve (e.g., either an opening torque curve or a closing torque curve) according to the following equation:

$$\text{Area}(n) = \int_0^{100} T(i) di \qquad \text{Equation 2}$$

where "n" is a numerical identifier of the torque curve, "T(i)" is the detected torque (T) as a function of the detected position (i), and "di" is a change in position (i). Area under the torque curve data corresponding to the area under the torque curve determined and/or calculated by the controller 132 of the workstation 104 of FIG. 1 can be stored in a non-transitory computer-readable storage medium such as the memory 136 of FIG. 1 described below. The stored area under the torque curve data can subsequently be accessed by the controller 132 of FIG. 1 from the memory 136 of FIG. 1.

For each torque curve (e.g., each opening torque curve and each closing torque curve) included in the obtained torque curve data, the controller 132 of the workstation 104 of FIG. 1 also determines and/or calculates a variance (e.g., a variance in percentage) between the area under the torque curve and an area under a reference curve. For example, the controller 132 can determine and/or calculate a variance between the area under the torque curve (e.g., either an opening torque curve or a closing torque curve) and a reference torque curve according to the following equation:

$$\text{Variance}(n) = \frac{\text{Area}(n) - \text{AreaRef}}{\text{AreaRef}} * 100 \qquad \text{Equation 3}$$

where "n" is a numerical identifier of the torque curve, "Area(n)" is the area under the torque curve as determined and/or calculated using Equation 1 or Equation 2 above, and "AreaRef" is the area under the reference curve. In some examples, the variance calculated by the controller 132 of FIG. 1 represents and/or corresponds to a friction force associated with the electric motor 112 and/or, more generally, the electric actuator 110 of FIG. 1. Variance data corresponding to the variance for the torque curve determined and/or calculated by the controller 132 of the workstation 104 of FIG. 1 can be stored in a non-transitory computer-readable storage medium such as the memory 136 of FIG. 1 described below. The stored variance data can subsequently be accessed by the controller 132 of FIG. 1 from the memory 136 of FIG. 1.

For each torque curve (e.g., each opening torque curve and each closing torque curve) included in the obtained torque curve data, the controller 132 of the workstation 104 of FIG. 1 also determines whether the calculated variance exceeds a variance threshold. For example, the controller 132 can compare the calculated variance associated with a torque curve to a variance threshold. In some examples, the variance threshold can be a maximum positive variance threshold (e.g., 50%, 100%, 150%, etc.). In other examples, the variance threshold can be a maximum negative variance threshold (e.g., −50%, −100%, −150%, etc.). In still other examples, the variance threshold can be an absolute variance threshold (e.g., +/−50%, +/−100%, +/−150%, etc.).

If the controller 132 of the workstation 104 of FIG. 1 determines that the variance associated with the torque curve does not exceed the variance threshold, the controller 132 generates one or more control signal(s), instruction(s) and/or command(s) indicating that the electric actuator 110 of FIG. 1 is healthy and/or functional. In some examples, such a determination can be based on whether the variances associated with a predetermined successive number (e.g., two, five, ten, etc.) of the torque curves fail to exceed the variance threshold. If the controller 132 of the workstation of FIG. 1 instead determines that the variance associated with the torque curve exceeds the variance threshold, the controller 132 generates one or more control signal(s), instruction(s) and/or command(s) indicating that the electric actuator 110 of FIG. 1 is unhealthy and/or non-functional. In some examples, such a determination can be based on whether the variances associated with a predetermined successive number (e.g., two, five, ten, etc.) of the torque curves exceed the variance threshold. In some examples, the health status indication control signal(s), instruction(s) and/or command(s) generated by the controller 132 of FIG. 1 can instruct and/or cause the user interface 134 of the workstation 104 of FIG. 1 to present one or more visual, textual, graphical, audible and/or tactile notification(s), message(s) and/or alert(s) indicating that the electric actuator 110 is either healthy (e.g., functional) or unhealthy (e.g., non-functional).

In some examples, the above-described area under the torque curve calculations, variance calculations, and variance threshold comparisons can be implemented and/or performed on a more granular basis to achieve a more detailed analysis of the torque curve data. In some examples, the controller 132 of the workstation 104 of FIG. 1 can organize, partition and/or segment each of the opening and closing torque curves into a breakout stage, a running stage, and an ending stage. In some examples, the controller 132 can partition and/or segment an opening torque curve or a closing torque curve into breakout, running, and ending stages based on predetermined (e.g., pre-programmed) partitioning parameters associated with the motor-operated valve 102. For example, the torque curve data for an opening torque curve can be partitioned and/or segmented into a breakout stage covering the first twenty percent (20%) of the opening torque curve, a running stage curve covering the next sixty percent (60%) of the opening torque curve, and an ending stage covering the final twenty percent (20%) of the opening torque curve. The torque curve data for a closing torque curve can be partitioned and/or segmented according to the same or different parameters as the torque curve data for the opening torque curve. For example, the torque curve data for a closing torque curve can be partitioned and/or segmented into a breakout stage covering the first ten percent (10%) of the closing torque curve, a running stage covering the next eighty percent (80%) of the closing torque curve, and an ending stage covering the final ten percent (10%) of the opening torque curve. In such examples, the above-described area under the torque curve calculations, variance calculations, and variance threshold comparisons can be implemented and/or performed separately for each of the above-described breakout, running, and ending stages.

The user interface 134 of the workstation 104 of FIG. 1 facilitates interactions and/or communications between a user of the workstation 104 and the controller 132 of the workstation 104. Data and/or information that is presented and/or received via the user interface 134 can be of any type, form and/or format, and can be stored in a non-transitory computer-readable storage medium such as the memory 136 of FIG. 1 described below.

The user interface 134 of FIG. 1 includes one or more example input device(s) 142 via which the user can input information and/or data to the controller 132, and/or, more generally, to the workstation 104 of FIG. 1. For example, the user interface 134 can include one or more button(s), one or more switch(es), a keyboard, a mouse, a microphone and/or a liquid crystal display having a touchscreen that enable(s) the user to convey data and/or commands to the controller 132, and/or, more generally, to the workstation 104. In some examples, the information request(s) and/or the control signal(s) described above can be generated via the user interface 134 in response to one or more input(s) by a user to the one or more input device(s) 142 of the user interface 134.

The user interface 134 of FIG. 1 also includes one or more example output device(s) 144 via which the controller 132, and/or, more generally, the workstation 104 presents information and/or data in visual and/or audible form to the user of the workstation 104. For example, the user interface 134 can include one or more light emitting diode(s) for presenting visual information, one or more speaker(s) for presenting audible information, and/or a display device (e.g., a liquid crystal display, a cathode ray tube display, etc.) for presenting textual and/or graphical information. In some examples, the health status indication control signal(s), instruction(s) and/or command(s) generated by the controller 132 associated with the determined functionality and/or the determined health status of the electric actuator 110 of FIG. 1 can be presented as notification(s), message(s) and/or alert(s) via the one or more output device(s) 144 of the user interface 134.

Figure 2:
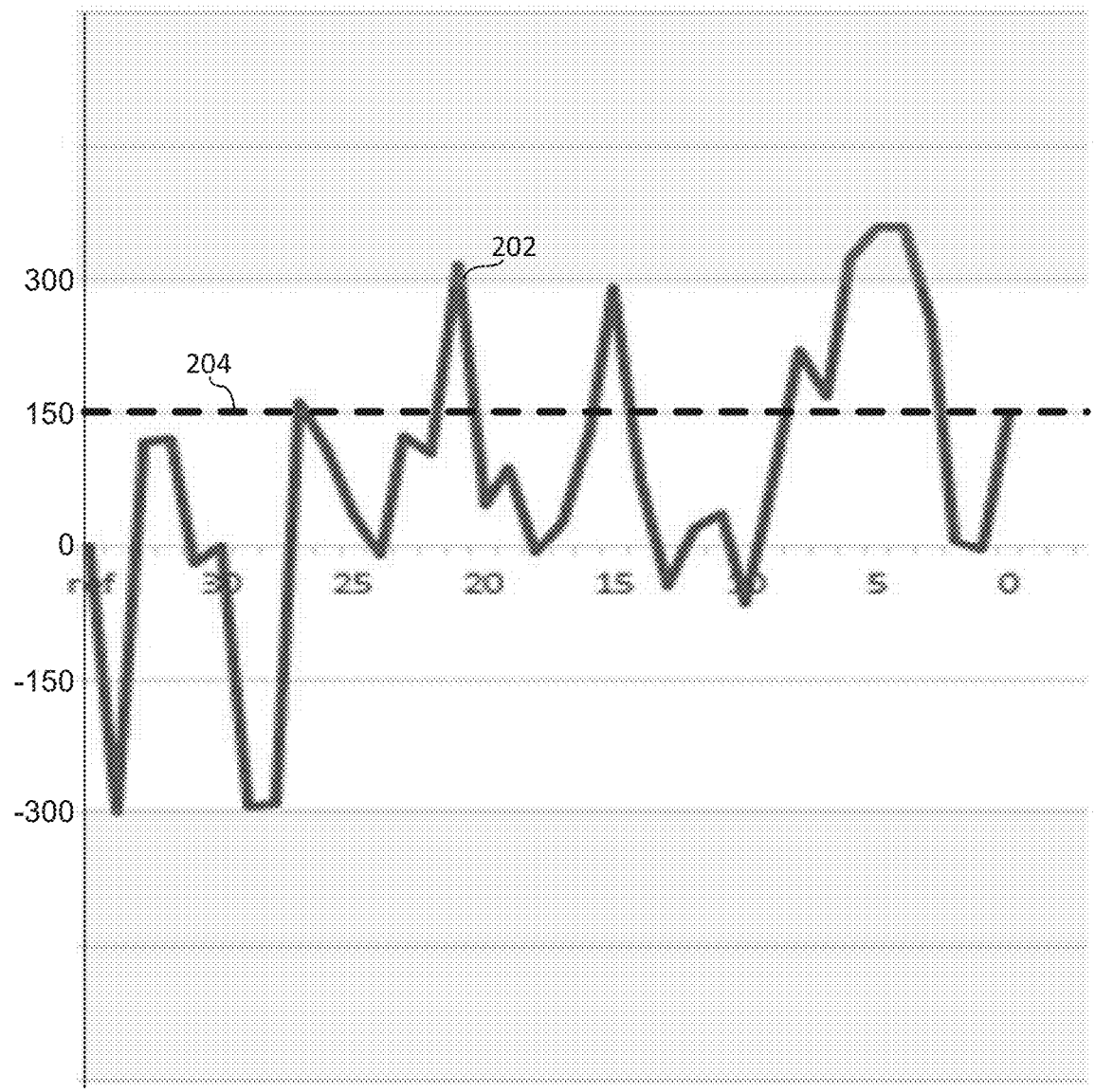
FIG. 2 is an example torque trend graph generated by the example workstation of FIG. 1 based on torque curve data obtained from the example electric actuator of FIG. 1 for a successive number of opening torque curves.
Figure 3:
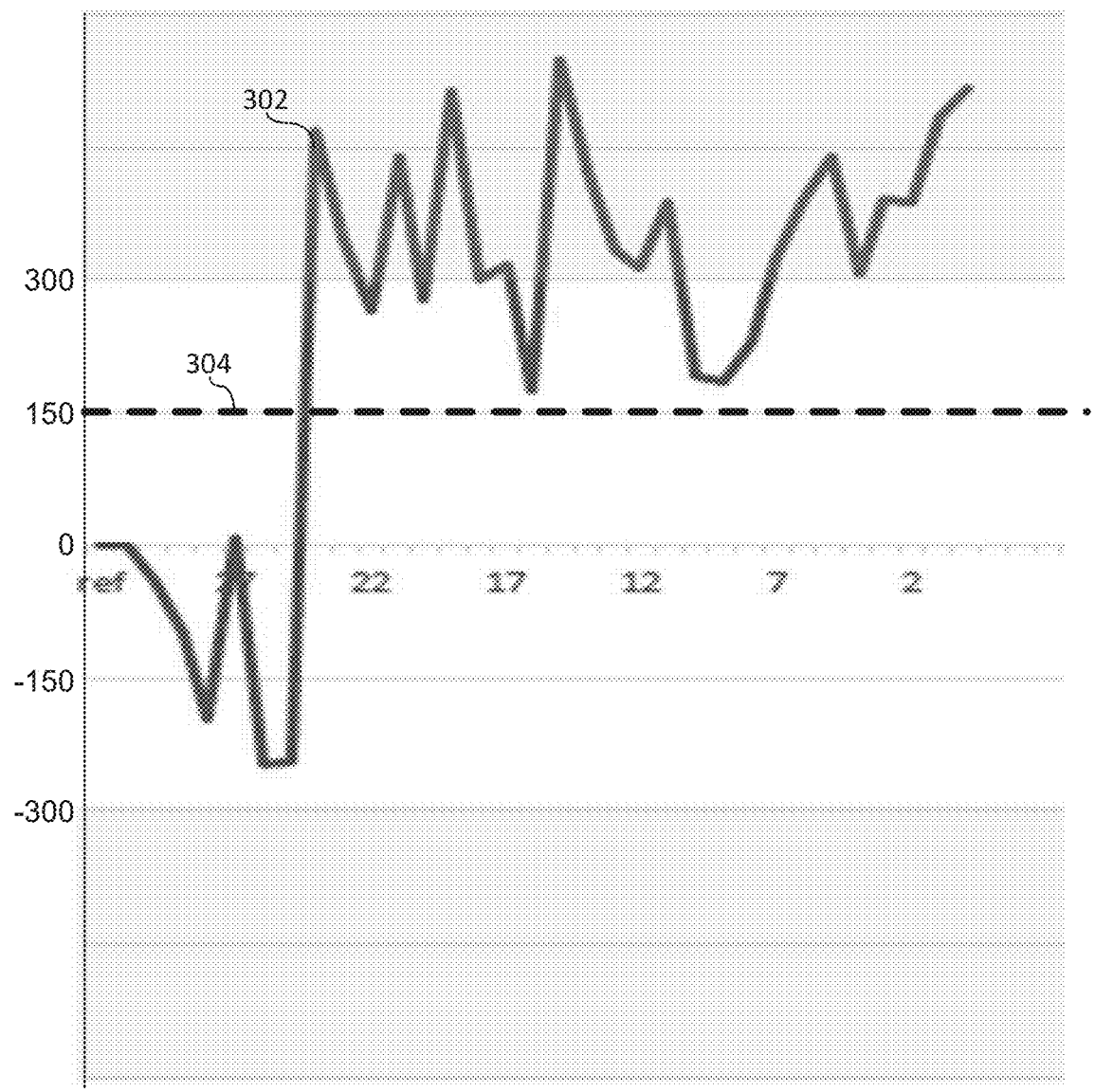
FIG. 3 is an example torque trend graph generated by the example workstation of FIG. 1 based on torque curve data obtained from the example electric actuator of FIG. 1 for a successive number of closing torque curves.

In some examples, a display device implemented as one of the output device(s) 144 of the user interface 134 of the workstation 104 of FIG. 1 presents one or more torque trend plot(s) corresponding to the calculated variances of successive ones of the opening or closing torque curves from among the torque curve data historically obtained from the electric actuator 110 of FIG. 1. In some such examples, the display device can present separate torque trend plots for the variances of successive ones of the opening torque curves and the variances of successive ones of the closing torque curves. For example, FIG. 2 is an example torque trend graph 200 generated by the example workstation 104 of FIG. 1 based on torque curve data obtained from the example electric actuator 110 of FIG. 1 for a successive number of opening torque curves. FIG. 3 is an example torque trend graph 300 generated by the example workstation 104 of FIG. 1 based on torque curve data obtained from the example electric actuator 110 of FIG. 1 for a successive number of closing torque curves. The torque trend graph 200 of FIG. 2 and/or the torque trend graph 300 of FIG. 3 can be presented by the display device of the user interface 134 of FIG. 1.

In the illustrated example of FIG. 2, the torque trend graph 200 includes an example torque trend plot 202 of variance value and/or friction force (e.g., the vertical axis) associated with the opening torque curve as a function of a curve identifier (e.g., the horizontal axis) associated with the opening torque curve. In some examples, the curve identifier is a numerical identifier associated with the opening torque curve based on the historical age of the opening torque curve (e.g., based on when the opening torque curve was first generated). In the illustrated example of FIG. 2, the most recent opening torque curve has a curve identifier equal to zero (0), the next most recent opening torque curve has a curve identifier equal to one (1), the second next most recent opening torque curve has a curve identifier equal to two (2), and so on. The torque trend graph 200 of FIG. 2 further includes an example variance and/or friction threshold 204 set to a value of approximately 150%.

In the illustrated example of FIG. 2, the torque trend plot 202 initially exceeds the variance and/or friction threshold 204 at a curve identifier equal to approximately twenty seven (27). The torque trend plot 202 also exceeds the variance and/or friction threshold 204 at successive curve identifiers equal to approximately twenty two (22) and twenty one (21). Other instances of the torque trend plot 202 exceeding the variance and/or friction threshold 204 are shown in FIG. 2 as well. The torque trend plot 202 of FIG. 2 accordingly indicates that the electric actuator 110 of FIG. 1 became unhealthy and/or non-functional at or near the time at which the opening torque curve corresponding to curve identifier twenty seven (27) or twenty two (22) was generated by the electric actuator 110 in conjunction with an actuation of the electric motor 112 of the electric actuator 110.

In the illustrated example of FIG. 3, the torque trend graph 300 includes an example torque trend plot 302 of variance value and/or friction force (e.g., the vertical axis) associated with the closing torque curve as a function of a curve identifier (e.g., the horizontal axis) associated with the closing torque curve. In some examples, the curve identifier is a numerical identifier associated with the closing torque curve based on the historical age of the closing torque curve (e.g., based on when the closing torque curve was first generated). In the illustrated example of FIG. 3, the most recent closing torque curve has a curve identifier equal to zero (0), the next most recent closing torque curve has a curve identifier equal to one (1), the second next most recent closing torque curve has a curve identifier equal to two (2), and so on. The torque trend graph 300 of FIG. 3 further includes an example variance and/or friction threshold 304 set to a value of approximately 150%.

In the illustrated example of FIG. 3, the torque trend plot 302 initially exceeds the variance and/or friction threshold 304 at a curve identifier equal to approximately twenty four (24). The torque trend plot 302 also exceeds the variance and/or friction threshold 304 at successive curve identifiers from twenty four (24) onward (e.g., twenty three (23), twenty two (22), twenty one (21), etc.) through the most recent curve identifier (e.g., zero (0)). The torque trend plot 302 of FIG. 3 accordingly indicates that the electric actuator 110 of FIG. 1 became unhealthy and/or non-functional at or near the time at which the closing torque curve corresponding to curve identifier twenty four (24) was generated by the electric actuator 110 in conjunction with an actuation of the electric motor 112 of the electric actuator 110.

Figure 4:
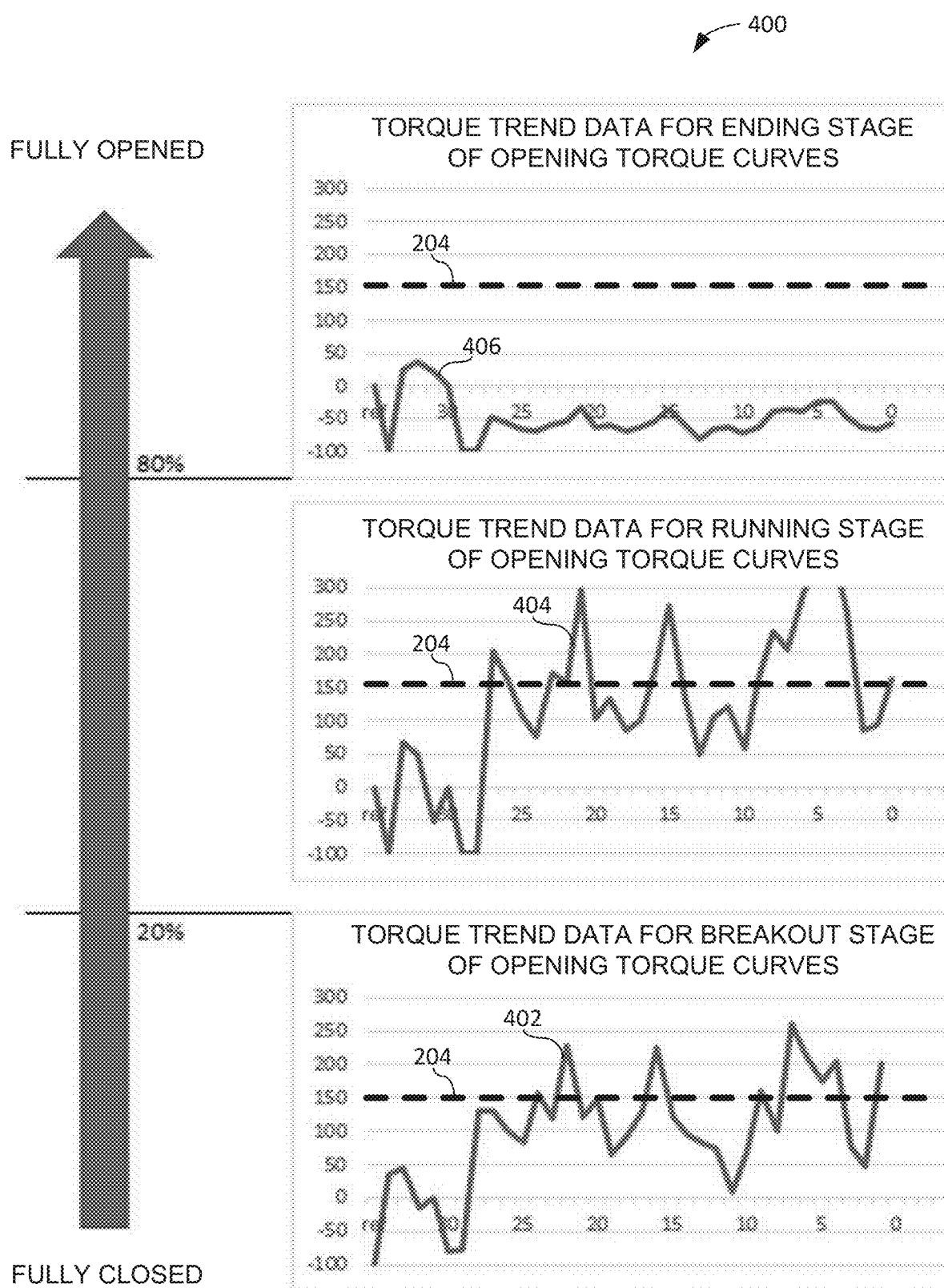
FIG. 4 is an example set of breakout, running, and ending stage torque trend graphs generated by the example workstation of FIG. 1 based on torque curve data obtained from the example electric actuator of FIG. 1 for a successive number of opening torque curves.
Figure 5:
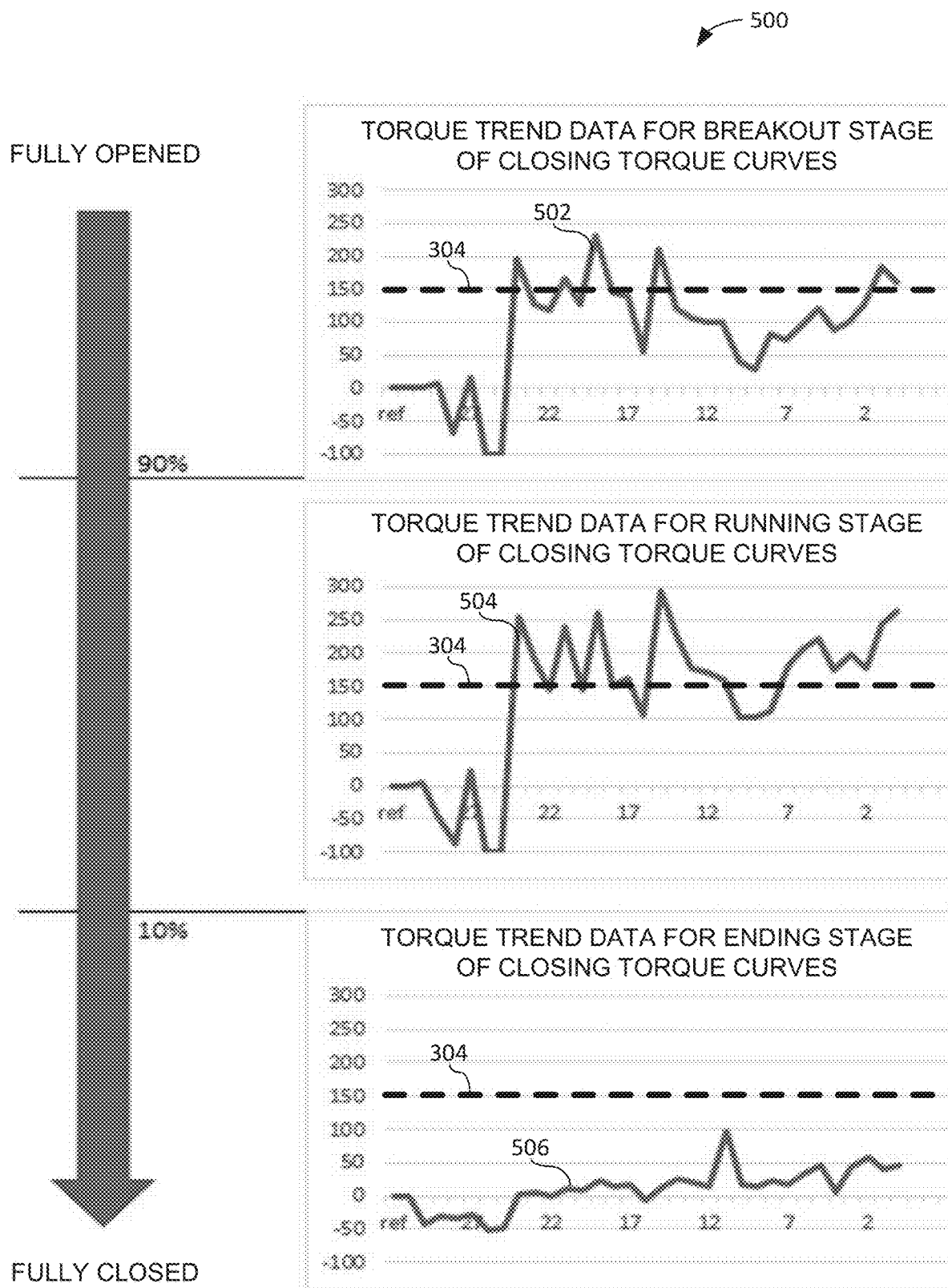
FIG. 5 is an example set of breakout, running, and ending stage torque trend graphs generated by the example workstation of FIG. 1 based on torque curve data obtained from the example electric actuator of FIG. 1 for a successive number of closing torque curves.

If variance data of a more granular variety is available, the display device of the user interface 134 of the workstation 104 of FIG. 1 can additionally or alternatively present separate breakout, running, and ending stage torque trend plots for the variances of successive ones of either the opening torque curves or the closing torque curves. For example, FIG. 4 is an example set of breakout, running, and ending stage torque trend graphs 400 generated by the example workstation 104 of FIG. 1 based on torque curve data obtained from the example electric actuator 110 of FIG. 1 for a successive number of opening torque curves. FIG. 5 is an example set of breakout, running, and ending stage torque trend graphs 500 generated by the example workstation 104 of FIG. 1 based on torque curve data obtained from the example electric actuator 110 of FIG. 1 for a successive number of closing torque curves. The set of breakout, running, and ending stage torque trend graphs 400 of FIG. 4 can be presented by the display device of the user interface 134 of FIG. 1 as a more granular and/or more detailed alternative to the torque trend graph 200 of FIG. 2 described above. Similarly, the set of breakout, running, and ending stage torque trend graphs 500 of FIG. 5 can be presented by the display device of the user interface 134 of FIG. 1 as a more granular and/or more detailed alternative to the torque trend graph 300 of FIG. 3 described above.

In the illustrated example of FIG. 4, the set of breakout, running, and ending stage torque trend graphs 400 includes an example breakout stage torque trend plot 402, an example running stage torque trend plot 404, and an example ending stage torque trend plot 406, each being a plot of variance value and/or friction force (e.g., the vertical axis) associated with a corresponding breakout, running, or ending stage of the opening torque curve as a function of a curve identifier (e.g., the horizontal axis) associated with the opening torque curve. The curve identifier is a numerical identifier associated with the opening torque curve based on the historical age of the opening torque curve (e.g., based on when the opening torque curve was first generated), as described above in connection with FIG. 2. Each graph within the set of breakout, running, and ending stage torque trend graphs 400 of FIG. 4 further includes the variance and/or friction threshold 204 of FIG. 2 described above (e.g., approximately 150%).

In the illustrated example of FIG. 4, the breakout stage torque trend plot 402 initially exceeds the variance and/or friction threshold 204 at a curve identifier equal to approximately twenty four (24). The breakout stage torque trend plot 402 also exceeds the variance and/or friction threshold 204 at successive curve identifiers equal to approximately twenty two (22) and twenty one (21). Other instances of the breakout stage torque trend plot 402 exceeding the variance and/or friction threshold 204 are shown in FIG. 4 as well. The breakout stage torque trend plot 402 of FIG. 4 accordingly indicates that the electric actuator 110 of FIG. 1 became unhealthy and/or non-functional at or near the time at which the opening torque curve corresponding to curve identifier twenty four (24) or twenty two (22) was generated by the electric actuator 110 in conjunction with an actuation of the electric motor 112 of the electric actuator 110.

As further shown in the illustrated example of FIG. 4, the running stage torque trend plot 404 initially exceeds the variance and/or friction threshold 204 at a curve identifier equal to approximately twenty seven (27). The running stage torque trend plot 404 also exceeds the variance and/or friction threshold 204 at successive curve identifiers equal to approximately twenty two (22) and twenty one (21). Other instances of the running stage torque trend plot 404 exceeding the variance and/or friction threshold 204 are shown in FIG. 4 as well. The running stage torque trend plot 404 of FIG. 4 accordingly indicates that the electric actuator 110 of FIG. 1 became unhealthy and/or non-functional at or near the time at which the opening torque curve corresponding to curve identifier twenty seven (27) or twenty two (22) was generated by the electric actuator 110 in conjunction with an actuation of the electric motor 112 of the electric actuator 110.

In the illustrated example of FIG. 5, the set of breakout, running, and ending stage torque trend graphs 500 includes an example breakout stage torque trend plot 502, an example running stage torque trend plot 504, and an example ending stage torque trend plot 506, each being a plot of variance value and/or friction force (e.g., the vertical axis) associated with a corresponding breakout, running, or ending stage of the closing torque curve as a function of a curve identifier (e.g., the horizontal axis) associated with the closing torque curve. The curve identifier is a numerical identifier associated with the closing torque curve based on the historical age of the closing torque curve (e.g., based on when the closing torque curve was first generated), as described above in connection with FIG. 2. Each graph within the set of breakout, running, and ending stage torque trend graphs 500 of FIG. 5 further includes the variance and/or friction threshold 304 of FIG. 3 described above (e.g., approximately 150%).

In the illustrated example of FIG. 5, the breakout stage torque trend plot 502 initially exceeds the variance and/or friction threshold 304 at a curve identifier equal to approximately twenty four (24). The breakout stage torque trend plot 502 also exceeds the variance and/or friction threshold 304 at successive curve identifiers equal to approximately twenty four (24) and twenty three (23). Other instances of the breakout stage torque trend plot 502 exceeding the variance and/or friction threshold 304 are shown in FIG. 5 as well. The breakout stage torque trend plot 502 of FIG. 5 accordingly indicates that the electric actuator 110 of FIG. 1 became unhealthy and/or non-functional at or near the time at which the closing torque curve corresponding to curve identifier twenty four (24) was generated by the electric actuator 110 in conjunction with an actuation of the electric motor 112 of the electric actuator 110.

As further shown in the illustrated example of FIG. 5, the running stage torque trend plot 504 initially exceeds the variance and/or friction threshold 304 at a curve identifier equal to approximately twenty four (24). The running stage torque trend plot 504 also exceeds the variance and/or friction threshold 304 at successive curve identifiers equal to approximately twenty four (24) and twenty three (23). Other instances of the running stage torque trend plot 504 exceeding the variance and/or friction threshold 304 are shown in FIG. 5 as well. The running stage torque trend plot 504 of FIG. 5 accordingly indicates that the electric actuator 110 of FIG. 1 became unhealthy and/or non-functional at or near the time at which the opening torque curve corresponding to curve identifier twenty four (24) was generated by the electric actuator 110 in conjunction with an actuation of the electric motor 112 of the electric actuator 110.

Returning to the illustrated example of FIG. 1, the memory 136 of the workstation 104 of FIG. 1 can be implemented by any type(s) and/or any number(s) of storage device(s) such as a storage drive, a flash memory, a read-only memory (ROM), a random-access memory (RAM), a cache and/or any other storage medium in which information is stored for any duration (e.g., for extended time periods, permanently, brief instances, for temporarily buffering, and/or for caching of the information). The information stored in the memory 136 can be stored in any file and/or data structure format, organization scheme, and/or arrangement.

Data and/or information received by the receiver 140 of the network interface 130, the controller 132, and/or the input device(s) 142 of the user interface 134 of the workstation 104 of FIG. 1 can be stored in the memory 136 of the workstation 104 of FIG. 1. Data and/or information corresponding to any of the above-described torque data, position data, torque curve data, area equation(s), area under the torque curve data, variance equation(s), variance data, variance threshold(s), information request(s), control signal(s), instruction(s), command(s), notification(s), message(s), alert(s), torque trend graph(s), and/or torque trend plot(s) can be stored in the memory 136. Data and/or information stored in the memory 136 is accessible to the network interface 130, the controller 132 and/or the user interface 134 of the workstation 104 of FIG. 1. In some examples, data and/or information stored in the memory 136 of the workstation 104 of FIG. 1 can be transmitted over the network 124 of FIG. 1 from the workstation 104 to the electric actuator 110 of FIG. 1 via the transmitter 138 of the network interface 130 of FIG. 1.

The workstation 104 and the electric actuator 110 of FIG. 1 can be arranged and/or structured in a manner that differs from that disclosed above. For example, one or more of the above-described operation(s) of the controller 132 and/or the user interface 134 of the workstation 104 of FIG. 1 can additionally or alternatively be performed at and/or by the electric actuator 110 of FIG. 1. Such an arrangement can advantageously provide for a fully-integrated electric actuator 110 capable of self-diagnosing and/or self-identifying its own health status, and presenting a corresponding health status indication at the electric actuator 110 itself.

While an example manner of implementing the example process control system 100 is illustrated in FIG. 1, one or more of the elements, processes and/or devices illustrated in FIG. 1 can be combined, divided, re-arranged, omitted, eliminated and/or implemented in any other way. Further, the example electric motor 112, the example torque sensor 114, the example position sensor 116, the example network interface 118, the example controller 120 and/or the example memory 122 of the example electric actuator 110 of FIG. 1, and/or the example network interface 130, the example controller 132, the example user interface 134 and/or the example memory 136 of the example workstation 104 of FIG. 1, can be implemented by hardware, software, firmware and/or any combination of hardware, software and/or firmware. Thus, for example, any of the example electric motor 112, the example torque sensor 114, the example position sensor 116, the example network interface 118, the example controller 120 and/or the example memory 122 of the example electric actuator 110 of FIG. 1, and/or the example network interface 130, the example controller 132, the example user interface 134 and/or the example memory 136 of the example workstation 104 of FIG. 1 could be implemented by one or more analog or digital circuit(s), logic circuit(s), programmable processor(s), programmable controller(s), graphics processing unit(s), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example electric motor 112, the example torque sensor 114, the example position sensor 116, the example network interface 118, the example controller 120 and/or the example memory 122 of the example electric actuator 110 of FIG. 1, and/or the example network interface 130, the example controller 132, the example user interface 134 and/or the example memory 136 of the example workstation 104 of FIG. 1 is/are hereby expressly defined to include a non-transitory computer-readable storage device or storage disk such as a memory, a digital versatile disk (DVD), a compact disk (CD), a Blu-ray disk, etc. including the software and/or firmware. Further still, the example electric actuator 110, the example workstation 104, and/or, more generally, the example process control system 100 of FIG. 1 can include one or more elements, processes and/or devices in addition to, or instead of, those illustrated in FIG. 1, and/or can include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 6:
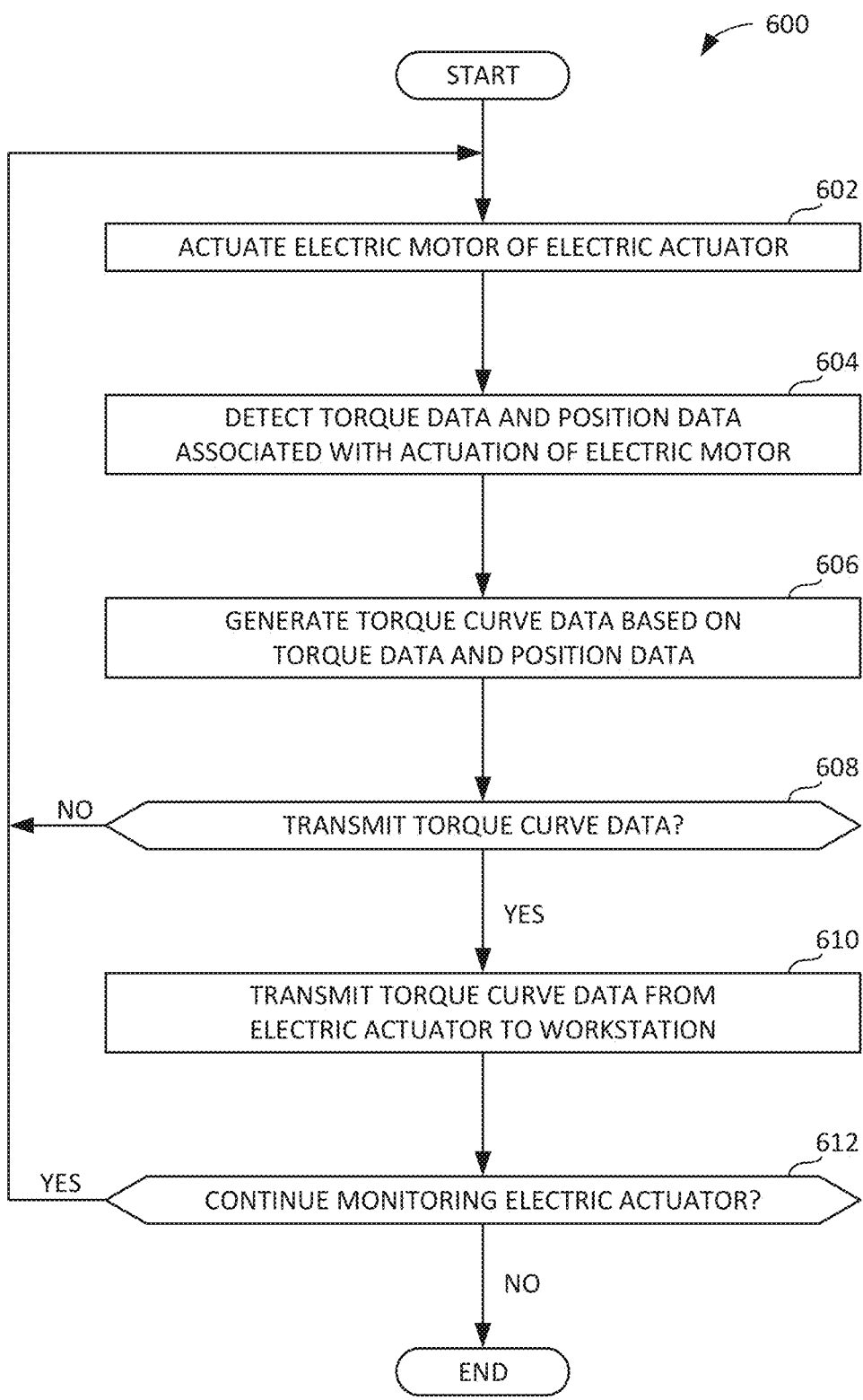
FIG. 6 is a flowchart representative of an example method that can be executed at the example electric actuator of FIG. 1 to generate and transmit torque curve data associated with the example electric actuator.
Figure 7:
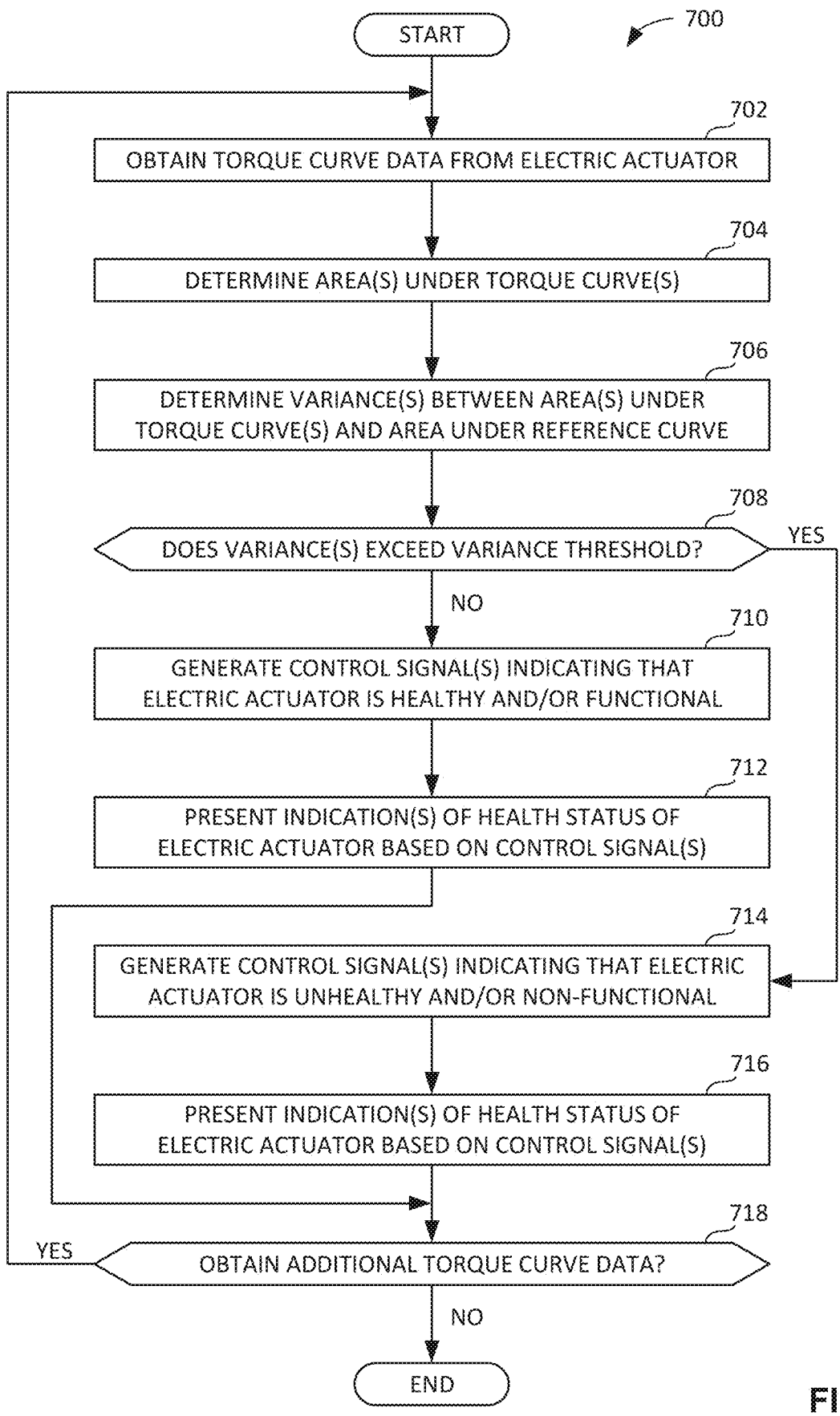
FIG. 7 is a flowchart representative of an example method that can be executed at the example workstation of FIG. 1 to determine a health status of the example electric actuator of FIG. 1 based on torque trend data associated with the example electric actuator.

A flowchart representative of an example method for generating and transmitting torque curve data associated with the example electric actuator 110 of FIG. 1 is shown in FIG. 6. A flowchart representative of an example method for determining a health status of the example electric actuator 110 of FIG. 1 based on torque trend data associated with the example electric actuator 110 is shown in FIG. 7. In each of these examples, the method can be implemented using machine-readable instructions that comprise one or more program(s) for execution by a controller or processor such as the example processor 802 shown in the example processor platform 800 discussed below in connection with FIG. 8, and/or the example processor 902 shown in the example processor platform 900 discussed below in connection with FIG. 9. The one or more program(s) can be embodied in software stored on a non-transitory computer-readable storage medium such as a CD-ROM, a floppy disk, a hard drive, a digital versatile disk (DVD), a Blu-ray disk, or a memory associated with the processor 802 or the processor 902, but the entire program(s) and/or parts thereof could alternatively be executed by a device other than the processor 802 or the processor 902, and/or embodied in firmware or dedicated hardware. Further, although the example program(s) is/are described with reference to the flowcharts illustrated in FIGS. 6 and 7, many other methods for generating and transmitting torque curve data associated with the example electric actuator 110 of FIG. 1, and/or for determining a health status of the example electric actuator 110 of FIG. 1 based on torque trend data associated with the example electric actuator 110 of FIG. 1, can alternatively be used. For example, the order of execution of the blocks can be changed, and/or some of the blocks described can be changed, eliminated, or combined.

As mentioned above, the example methods of FIGS. 6 and 7 can be implemented using executable instructions (e.g., computer and/or machine-readable instructions) stored on a non-transitory computer and/or machine-readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term "non-transitory computer-readable storage medium" is expressly defined to include any type of computer-readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. can be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

FIG. 6 is a flowchart representative of an example method 600 that can be executed at the example electric actuator 110 of FIG. 1 to generate and transmit torque curve data associated with the example electric actuator 110. The example method 600 of FIG. 6 begins when the controller 120 of FIG. 1 actuates the electric motor 112 of the electric actuator 110 of FIG. 1 (block 602). For example, the controller 120 of FIG. 1 can generate one or more control signal(s), instruction(s) and/or command(s) to actuate the electric motor 112 of the electric actuator 110 of FIG. 1. In some examples, the one or more control signal(s), instruction(s) and/or command(s) generated by the controller 120 of FIG. 1 to actuate the electric motor 112 can correspond to and/or be derived from one or more control signal(s), instruction(s) and/or command(s) received at the receiver 128 of the network interface 118 of the electric actuator 110 of FIG. 1 from the workstation 104 of FIG. 1.

The torque sensor 114 and the position sensor 116 of FIG. 1 correspondingly detect torque data and position data associated with the actuation of the electric motor 112 of FIG. 1 (block 604). For example, in conjunction with (e.g., at or near the same time as) generating the control signal(s), instruction(s) and/or command(s) to actuate the electric motor 112, the controller 120 of FIG. 1 can also instruct and/or command the torque sensor 114 and/or the position sensor 116 of the electric actuator 110 of FIG. 1 to detect, sense and/or measure torque data and/or position data associated with the actuation of the electric motor 112. In such an example, the controller 120 of FIG. 1 can instruct and/or command the torque sensor 114 and/or the position sensor 116 to commence detecting, sensing and/or measuring torque data and/or position data prior to the initiation of the actuation of the electric motor 112, and can further instruct and/or command the torque sensor 114 and/or the position sensor 116 to cease detecting, sensing and/or measuring torque data and/or position data subsequent to the completion of the actuation of the electric motor 112.

The controller 120 of FIG. 1 generates torque curve data based on the torque data detected by and torque sensor 114 of FIG. 1 and the position data detected by position sensor 116 of FIG. 1 (block 606). For example, the controller 120 of FIG. 1 can generate torque curve data (e.g., one or more torque curves) including and/or based on detected torque data the controller 120 has correlated and/or synchronized with detected position data. In some examples, the controller 120 of FIG. 1 generates the torque curve data in real time as the torque sensor 114 and the position sensor 116 of FIG. 1 respectively detect the torque data and the position data associated with the electric motor 112 of FIG. 1 actuating the flow control member 106 of the motor-operated valve 102 of FIG. 1 from the open position to the closed position, or vice-versa. In some examples, the controller 120 of FIG. 1 can organize, partition and/or segment the torque curve data into one or more opening torque curve(s) associated with the electric motor 112, the shaft 108, and/or the flow control member 106 of the motor-operated valve 102 of FIG. 1 being actuated from the closed position to the open position (e.g., 0% open to 100% open), and one or more closing torque curve(s) associated with the electric motor 112, the shaft 108, and/or the flow control member 106 of the motor-operated valve 102 of FIG. 1 being actuated from the open position to the closed position (e.g., 0% closed to 100% closed).

The controller 120 of FIG. 1 determines whether and/or when to transmit the torque curve data (block 608). For example, the controller 120 of FIG. 1 can monitor the memory 122 of the electric actuator 110 of FIG. 1 for the introduction of new and/or updated torque curve data. In such an example, the controller 120 of FIG. 1 can determine at block 608 that the new and/or updated torque curve data stored in the memory 122 of FIG. 1 is to be transmitted from the electric actuator 110 of FIG. 1 to the workstation 104 of FIG. 1 upon the new and/or updated torque curve data being identified by the controller 120.

As another example, the controller 120 of FIG. 1 can monitor the status of a timer corresponding to a time and/or a period of time (e.g., every minute, every hour, every twelve hours, every twenty four hours, etc.) at which the torque curve data stored in the memory 122 of FIG. 1 is to be transmitted. In such an example, the controller 120 of FIG. 1 can determine that the torque curve data stored in the memory 122 of FIG. 1 is to be transmitted from the electric actuator 110 of FIG. 1 to the workstation 104 of FIG. 1 in response to the controller 120 determining at block 608 that the timer indicates an arrival of the time and/or an expiration of the time period.

As another example, the controller 120 of FIG. 1 can monitor a remaining storage capacity associated with the memory 122 of FIG. 1, and can determine whether the remaining storage capacity of the memory 122 falls below and/or fails to exceed a remaining storage capacity threshold. In such an example, the controller 120 of FIG. 1 can determine at block 608 that the torque curve data stored in the memory 122 of FIG. 1 is to be transmitted from the electric actuator 110 of FIG. 1 to the workstation 104 of FIG. 1 in response to the controller 120 determining that the remaining storage capacity of the memory 122 falls below and/or fails to exceed the remaining storage capacity threshold.

As another example, the controller 120 of FIG. 1 can monitor the network interface 118 and/or the memory 122 of the electric actuator 110 of FIG. 1 for the arrival of one or more information request(s) at the electric actuator 110 from the workstation 104 of FIG. 1. In such an example, the controller 120 of FIG. 1 can determine at block 608 that the torque curve data stored in the memory 122 of FIG. 1 is to be transmitted from the electric actuator 110 of FIG. 1 to the workstation 104 of FIG. 1 in response to the controller 120 identifying the information request(s).

If the controller 120 of FIG. 1 determines at block 608 that the torque curve data is to be transmitted, control of the example method 600 of FIG. 6 proceeds to block 610. If the controller 120 of FIG. 1 instead determines at block 608 that the torque curve data is not to be transmitted, control of the example method 600 of FIG. 6 returns to block 602.

At block 610, the transmitter 126 of the network interface 118 of FIG. 1 transmits the torque curve data from the electric actuator 110 of FIG. 1 to the workstation 104 of FIG. 1 (block 610). For example, the transmitter 126 of the network interface 118 of FIG. 1 can transmit the torque curve data from the electric actuator 110 of FIG. 1 to the workstation 104 of FIG. 1 in response to one or more control signal(s), instruction(s) and/or command(s) generated by the controller 120 of FIG. 1 directing the transmitter 126 of the network interface 118 to transmit the torque curve data to the workstation 104. Following block 610, control of the example method 600 of FIG. 6 proceeds to block 612.

At block 612, the controller 120 of FIG. 1 determines whether monitoring of the electric actuator 110 of FIG. 1 is to continue (block 612). For example, the controller 120 of FIG. 1 can receive one or more control signal(s), instruction(s) and/or command(s) from the workstation 104 of FIG. 1 directing the controller 120 to cease monitoring of the electric actuator 110. If the controller 120 of FIG. 1 determines at block 612 that the monitoring of the electric actuator 110 of FIG. 1 is to continue, control of the example method 600 of FIG. 6 returns to block 602. If the controller 120 of FIG. 1 instead determines at block 612 that the monitoring of the electric actuator 110 of FIG. 1 is not to continue, the example method 600 of FIG. 6 ends.

FIG. 7 is a flowchart representative of an example method 700 that can be executed at the example workstation 104 of FIG. 1 to determine a health status of the example electric actuator 110 of FIG. 1 based on torque trend data associated with the example electric actuator 110. The example method 700 of FIG. 7 can be performed at any level of granularity. For example, the method 700 of FIG. 7 can be performed separately (e.g., in series or in parallel) for opening and closing torque curves included in the torque curve data to be analyzed by the workstation 104. As another example, the method 700 of FIG. 7 can be performed separately (e.g., in series or in parallel) for breakout, running, and ending stages associated with opening or closing torque curves included in the torque curve data to be analyzed by the workstation 104.

The example method 700 of FIG. 7 begins when the controller 132 of FIG. 1 obtains torque curve data from the electric actuator 110 of FIG. 1 (block 702). In some examples, the controller 132 of FIG. 1 can generate one or more control signal(s), instructions(s) and/or command(s) structured as information request(s) that result in the controller 132 obtaining torque curve data from the electric actuator 110 of FIG. 1 at block 702. For example, the controller 132 of FIG. 1 can instruct and/or command the transmitter 138 of the network interface 130 of FIG. 1 to transmit the information request control signal(s), instruction(s) and/or command(s) from the workstation 104 of FIG. 1 to the electric actuator 110 of FIG. 1. In response to the transmission of such information request(s) and the receipt thereof at the electric actuator 110 of FIG. 1, the electric actuator 110 transmits the torque curve data stored in the memory 122 of FIG. 1 from the electric actuator 110 to the workstation 104 of FIG. 1. In other examples, the controller 132 of FIG. 1 can alternatively obtain torque curve data from the electric actuator 110 of FIG. 1 at block 702 by way of a data push operation initiated by the electric actuator 110, where the data push operation occurs without the controller 132 of FIG. 1 generating an information request for the torque curve data. Following block 702, control of the example method 700 of FIG. 7 proceeds to block 704.

For each torque curve included in the torque curve data, the controller 132 of FIG. 1 determines an area under the torque curve (block 704). For example, for each torque curve included in the obtained torque curve data, the controller 132 of FIG. 1 can calculate the area under the torque curve using Equation 1 or Equation 2 described above. Following block 704, control of the example method 700 of FIG. 7 proceeds to block 706.

For each torque curve included in the torque curve data, the controller 132 of FIG. 1 also determines a variance between the area under the torque curve and an area under a reference curve (block 706). For example, for each torque curve included in the obtained torques curve data, the controller 132 of FIG. 1 can calculate the variance between the area under the torque curve and the area under the reference curve using Equation 3 described above. Following block 706, control of the example method 700 of FIG. 7 proceeds to block 708.

For each torque curve included in the torque curve data, the controller 132 of FIG. 1 determines whether the calculated variance exceeds a variance threshold (block 708). For example, for each torque curve included in the torque curve data, the controller 132 of FIG. 1 can compare the calculated variance associated with the torque curve to the variance threshold. In some examples, the variance threshold can be a maximum positive variance threshold (e.g., 50%, 100%, 150%, etc.). In other examples, the variance threshold can be a maximum negative variance threshold (e.g., −50%, −100%, −150%, etc.). In still other examples, the variance threshold can be an absolute variance threshold (e.g., +/−50%, +/−100%, +/−150%, etc.). In some examples, the determination made by the controller 132 of FIG. 1 at block 708 can be based on whether the variances associated with a predetermined successive number (e.g., two, five, ten, etc.) of the torque curves exceed the variance threshold. If the controller 132 of FIG. 1 determines at block 708 that the variance(s) does/do not exceed the variance threshold, control of the example method 700 of FIG. 7 proceeds to block 710. If the controller 132 of FIG. 1 instead determines at block 708 that the variance(s) exceed(s) the variance threshold, control of the example method 700 of FIG. 7 proceeds to block 714.

At block 710, the controller 132 of FIG. 1 generates one or more control signal(s), instruction(s) and/or command(s) indicating that the electric actuator 110 of FIG. 1 is healthy and/or functional (block 710). For example, the controller 132 of FIG. 1 can generate one or more control signal(s), instruction(s) and/or command(s) directing the user interface 134 of the workstation 104 of FIG. 1 to present one or more notification(s), message(s) and/or alert(s) indicating that the electric actuator 110 of FIG. 1 is healthy and/or functional. In some examples, the controller 132 of the workstation 104 can additionally or alternatively transmit (e.g., via the transmitter 138 of the network interface 130 of FIG. 1) one or more control signal(s), instruction(s) and/or command(s) to the controller 120 of the electric actuator 110 of FIG. 1 directing the electric actuator 110 to present one or more notification(s), message(s) and/or alert(s) indicating that the electric actuator 110 is healthy and/or functional. Following block 710, control of the example method 700 of FIG. 7 proceeds to block 712.

At block 712, the user interface 134 of FIG. 1 presents an indication of the health status of the electric actuator 110 of FIG. 1 in response to the control signal(s), instruction(s) and/or command(s) generated by the controller 132 of FIG. 1 at block 710 (block 712). For example, the user interface 134 of FIG. 1 can present one or more visual, textual, graphical, audible and/or tactile notification(s), message(s) and/or alert(s) indicating that the electric actuator 110 of FIG. 1 is healthy and/or functional. Following block 712, control of the example method 700 of FIG. 7 proceeds to block 718.

At block 714, the controller 132 of FIG. 1 generates one or more control signal(s), instruction(s) and/or command(s) indicating that the electric actuator 110 of FIG. 1 is unhealthy and/or non-functional (block 714). For example, the controller 132 of FIG. 1 can generate one or more control signal(s), instruction(s) and/or command(s) directing the user interface 134 of the workstation 104 of FIG. 1 to present one or more notification(s), message(s) and/or alert(s) indicating that the electric actuator 110 of FIG. 1 is unhealthy and/or non-functional. In some examples, the controller 132 of the workstation 104 can additionally or alternatively transmit (e.g., via the transmitter 138 of the network interface 130 of FIG. 1) one or more control signal(s), instruction(s) and/or command(s) to the controller 120 of the electric actuator 110 of FIG. 1 directing the electric actuator 110 to present one or more notification(s), message(s) and/or alert(s) indicating that the electric actuator 110 is unhealthy and/or non-functional. Following block 714, control of the example method 700 of FIG. 7 proceeds to block 716.

At block 716, the user interface 134 of FIG. 1 presents an indication of the health status of the electric actuator 110 of FIG. 1 in response to the control signal(s), instruction(s) and/or command(s) generated by the controller 132 at block 714 (block 716). For example, the user interface 134 of FIG. 1 can present one or more visual, textual, graphical, audible and/or tactile notification(s), message(s) and/or alert(s) indicating that the electric actuator 110 of FIG. 1 is unhealthy and/or non-functional. Following block 716, control of the example method 700 of FIG. 7 proceeds to block 718.

At block 718, the controller 132 of FIG. 1 determines whether additional torque curve data is to be obtained (block 718). For example, the controller 132 of FIG. 1 can receive one or more control signal(s), instruction(s) and/or command(s) from the user interface 134 of the workstation 104 of FIG. 1 directing the controller 132 to obtain additional torque curve data. If the controller 132 of FIG. 1 determines at block 718 additional torque curve data is to be obtained, control of the example method 700 of FIG. 7 returns to block 702. If the controller 132 of FIG. 1 instead determines at block 718 that additional torque curve data is not to be obtained, the example method 700 of FIG. 7 ends.

Figure 8:
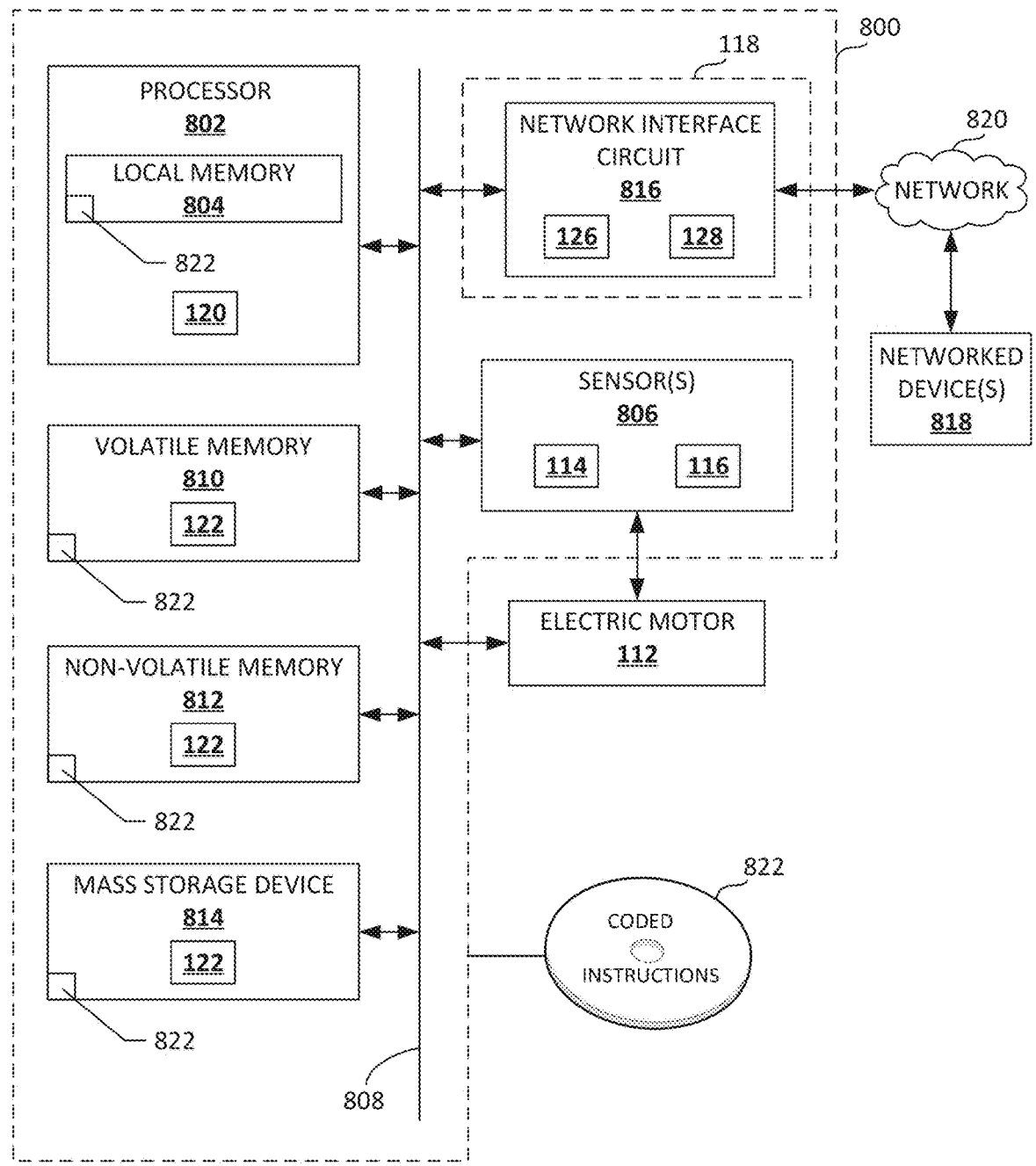
FIG. 8 is a block diagram of an example processor platform capable of executing instructions to implement the example method of FIG. 6 and the example electric actuator of FIG. 1.

FIG. 8 is a block diagram of an example processor platform 800 structured to execute instructions to implement the example method 600 of FIG. 6 and the example electric actuator 110 of FIG. 1. The processor platform 800 of the illustrated example includes a processor 802. The processor 802 of the illustrated example is hardware. For example, the processor 802 can be implemented by one or more integrated circuit(s), logic circuit(s), microprocessor(s), controller(s), GPU(s), or DSP(s) from any desired family or manufacturer. The processor 802 can be a semiconductor based (e.g., silicon based) device. In the example of FIG. 8, the processor 802 implements the example controller 120 of FIG. 1.

The processor 802 of the illustrated example also includes a local memory 804 (e.g., a cache). The processor 802 of the illustrated example is in communication with one or more sensor(s) 806 via a bus 808. In the example of FIG. 8, the sensor(s) 806 include the example torque sensor 114 and the example position sensor 116 of FIG. 1. The sensor(s) 806 are in communication with the electric motor 112 of FIG. 1, which is also in communication with the bus 808.

The processor 802 of the illustrated example is also in communication with a main memory including a volatile memory 810 and a non-volatile memory 812 via the bus 808. The volatile memory 810 can be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 812 can be implemented by flash memory and/or any other desired type of memory device. Access to the volatile memory 810 and the non-volatile memory 812 is controlled by a memory controller. In the illustrated example, the main memory 810, 812 includes the example memory 122 of FIG. 1.

The processor 802 of the illustrated example is also in communication with one or more mass storage device(s) 814 for storing software and/or data. Examples of such mass storage devices 814 include floppy disk drives, hard drive disks, compact disk drives, Blu-ray disk drives, RAID systems, and digital versatile disk (DVD) drives. In the illustrated example, the mass storage device 814 includes the example memory 122 of FIG. 1.

The processor platform 800 of the illustrated example also includes a network interface circuit 816. The network interface circuit 816 can be implemented by any type of interface standard, such as an Ethernet interface, a universal serial bus (USB), a Bluetooth® interface, a near field communication (NFC) interface, and/or a PCI express interface. The network interface circuit 816 of the illustrated example includes a communication device such as a transmitter, a receiver, a transceiver, a modem and/or network interface card to facilitate exchange of data with one or more networked device(s) 818 (e.g., computing and/or controller devices of any kind) via a network 820. In the illustrated example, the network interface circuit 816 includes the example transmitter 126 and the example receiver 128 of FIG. 1. In the illustrated example, the transmitter 126, the receiver 128, and the network interface circuit 816 collectively form the example network interface 118 of FIG. 1. In some examples, the network 820 can be facilitated via 4-20 mA wiring and/or via one or more communication protocol(s) including, for example, Foundation Fieldbus, Highway Addressable Remote Transducer (HART), Transmission Control Protocol/Internet Protocol (TCP/IP), Profinet, Modbus and/or Ethernet. In some examples, the networked device(s) 818 can include the example workstation 104 of FIG. 1.

Coded instructions 822 for implementing the example method 600 of FIG. 6 can be stored in the local memory 804, in the volatile memory 810, in the non-volatile memory 812, in the mass storage device 814, and/or on a removable tangible computer-readable storage medium such as a CD or DVD.

Figure 9:
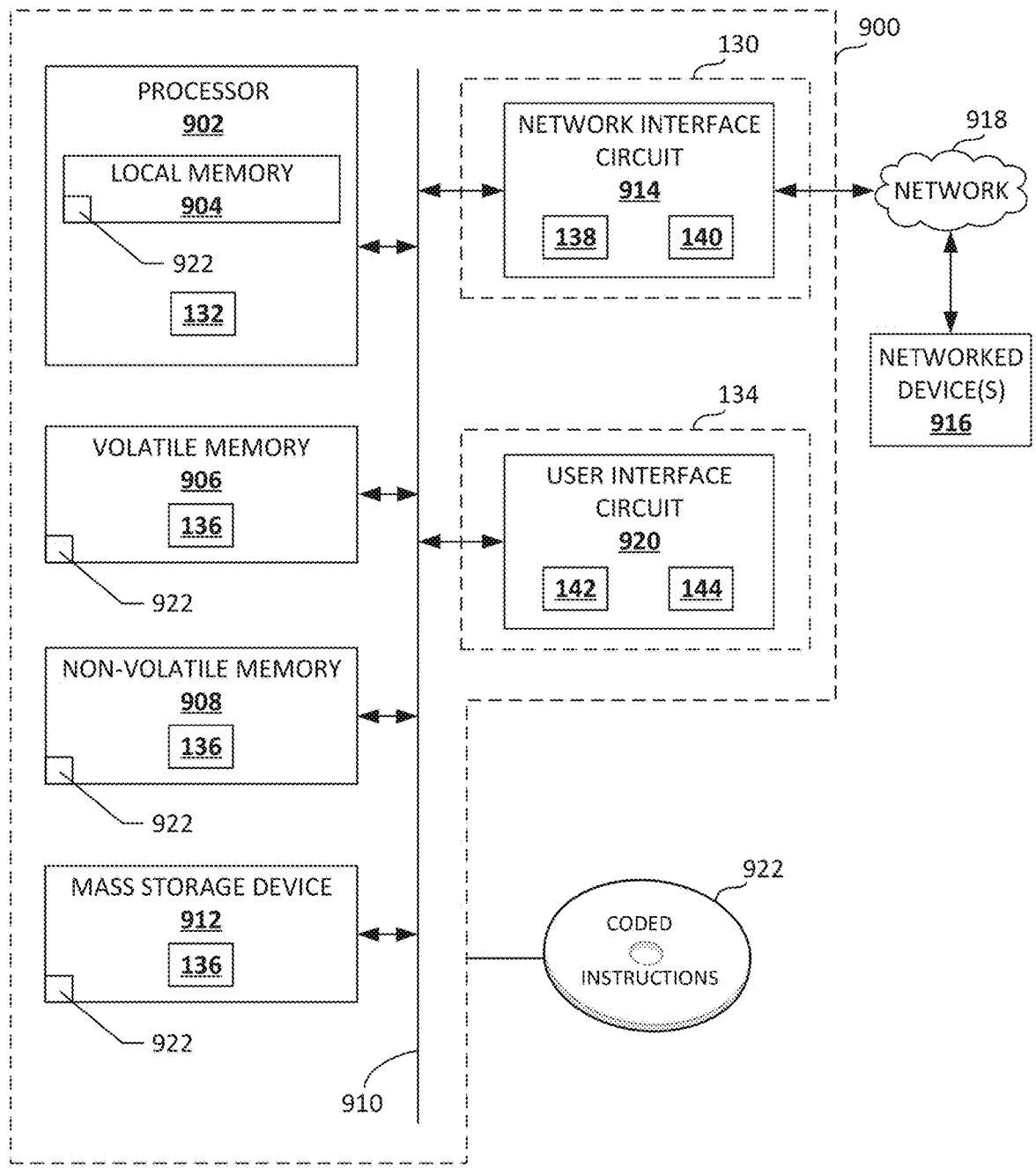
FIG. 9 is a block diagram of an example processor platform capable of executing instructions to implement the example method of FIG. 7 and the example workstation of FIG. 1.

FIG. 9 is a block diagram of an example processor platform 900 structured to execute instructions to implement the example method 700 of FIG. 7 and the example workstation 104 of FIG. 1. The processor platform 900 of the illustrated example includes a processor 902. The processor 902 of the illustrated example is hardware. For example, the processor 902 can be implemented by one or more integrated circuit(s), logic circuit(s), microprocessor(s), controller(s), GPU(s), or DSP(s) from any desired family or manufacturer. The processor 902 can be a semiconductor based (e.g., silicon based) device. In the example of FIG. 9, the processor 902 implements the example controller 132 of FIG. 1.

The processor 902 of the illustrated example includes a local memory 904 (e.g., a cache). The processor 902 of the illustrated example is in communication with a main memory including a volatile memory 906 and a non-volatile memory 908 via the bus 910. The volatile memory 906 can be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 908 can be implemented by flash memory and/or any other desired type of memory device. Access to the volatile memory 906 and the non-volatile memory 908 is controlled by a memory controller. In the illustrated example, the main memory 906, 908 includes the example memory 136 of FIG. 1.

The processor 902 of the illustrated example is also in communication with one or more mass storage devices 912 for storing software and/or data. Examples of such mass storage devices 912 include floppy disk drives, hard drive disks, compact disk drives, Blu-ray disk drives, RAID systems, and digital versatile disk (DVD) drives. In the illustrated example, the mass storage device 912 includes the example memory 136 of FIG. 1.

The processor platform 900 of the illustrated example also includes a network interface circuit 914. The network interface circuit 914 can be implemented by any type of interface standard, such as an Ethernet interface, a universal serial bus (USB), a Bluetooth® interface, a near field communication (NFC) interface, and/or a PCI express interface. The network interface circuit 914 of the illustrated example includes a communication device such as a transmitter, a receiver, a transceiver, a modem and/or network interface card to facilitate exchange of data with one or more networked device(s) 916 (e.g., computing, controller, and/or field devices of any kind) via a network 918. In the illustrated example, the network interface circuit 914 includes the example transmitter 138 and the example receiver 140 of FIG. 1. In the illustrated example, the transmitter 138, the receiver 140, and the network interface circuit 914 collectively form the example network interface 130 of FIG. 1. In some examples, the network 918 can be facilitated via 4-20 mA wiring and/or via one or more communication protocol(s) including, for example, Foundation Fieldbus, Highway Addressable Remote Transducer (HART), Transmission Control Protocol/Internet Protocol (TCP/IP), Profinet, Modbus and/or Ethernet. In some examples, the networked device(s) 916 can include the example electric actuator 110 and/or, more generally, the example motor-operated valve 102 of FIG. 1.

The processor platform 900 of the illustrated example also includes a user interface circuit 920. The user interface circuit 920 can be implemented by any type of interface standard, such as an Ethernet interface, a universal serial bus (USB), and/or a PCI express interface. In the illustrated example, the user interface circuit 920 includes and/or is connected to one or more of the example input device(s) 142 of FIG. 1. The input device(s) 142 permit(s) a user to enter data and commands into the processor 902. The input device(s) 142 can be implemented by, for example, one or more buttons, one or more switches, a keyboard, a mouse, a microphone and/or a liquid crystal display having a touchscreen. The user interface circuit 920 also includes and/or is connected to one or more of the example output device(s) 144 of FIG. 1. The output device(s) 144 can be implemented, for example, by one or more light emitting diode(s) for presenting visual information, one or more speaker(s) for presenting audible information, and/or a display device (e.g., a liquid crystal display, a cathode ray tube display, etc.) for presenting textual and/or graphical information. The user interface circuit 920 of the illustrated example can, thus, include a graphics driver such as a graphics driver chip and/or processor. In the illustrated example, the input device(s) 142, the output device(s) 144 and the user interface circuit 920 collectively form the example user interface 134 of FIG. 1.

Coded instructions 922 for implementing the example method 700 of FIG. 7 can be stored in the local memory 904, in the volatile memory 906, in the non-volatile memory 908, in the mass storage device 912, and/or on a removable tangible computer-readable storage medium such as a CD or DVD.

From the foregoing, it will be appreciated that the disclosed methods and apparatus advantageously analyze and/or post-process torque curve data obtained from an electric actuator at a time prior to the electric actuator becoming unhealthy. The disclosed methods and apparatus advantageously generate and present notification(s), message(s) and/or alert(s) indicating and/or identifying a current (e.g., real-time or near real-time) health status (e.g., healthy, functional, unhealthy, non-functional, etc.) of the electric actuator. In some examples, the disclosed methods and apparatus base the generation and/or presentation of such notification(s), message(s) and/or alert(s) on an analysis of torque trend data generated in relation to one or more torque curve(s) included in the torque curve data, as well as a reference torque curve. As a result of identifying the health status of the electric actuator prior to, at, and/or just after the time at which the electric actuator begins to show signs of becoming unhealthy, the disclosed methods and apparatus advantageously provide for advanced, real-time, and/or near real-time notification and/or warning of an actual or impending failure of the electric actuator. Such notification(s) and/or warning(s) advantageously enable the electric actuator to be serviced, removed from service, and/or replaced at a time which is substantially earlier than would otherwise be the case in connection with the known process control systems described above.

In some examples, an apparatus for determining a health status of an electric actuator of a motor-operated valve is disclosed. In some disclosed examples, the apparatus comprises a controller operatively coupled to the electric actuator via a network. In some disclosed examples, the controller is configured to obtain torque curve data over the network from the electric actuator. In some disclosed examples, the torque curve data is associated with actuation of an electric motor of the electric actuator. In some disclosed examples, the actuation is to cause a flow control member of the motor-operated valve to move. In some disclosed examples, the flow control member is mechanically coupled to the electric motor and is movable between an open position and a closed position. In some disclosed examples, the controller is further configured to determine an area under a torque curve based on the torque curve data. In some disclosed examples, the controller is further configured to determine a variance between the area under the torque curve and an area under a reference curve. In some disclosed examples, the controller is further configured to determine whether the variance exceeds a variance threshold. In some disclosed examples, the controller is further configured to generate a first control signal indicating that the electric actuator is healthy when it is determined that the variance does not exceed the variance threshold.

In some disclosed examples, the apparatus further comprises a user interface operatively coupled to the controller. In some disclosed examples, the user interface is configured to present a first notification indicating that the electric actuator is healthy, the first notification being based on the first control signal.

In some disclosed examples, the controller is further configured to generate a second control signal indicating that the electric actuator is unhealthy when it is determined that the variance exceeds the variance threshold. In some disclosed examples, the user interface is further configured to present a second notification indicating that the electric actuator is unhealthy, the second notification being based on the second control signal.

In some disclosed examples, the torque curve is partitioned into a breakout stage, a running stage, and an ending stage. In some disclosed examples, the controller is further configured to determine the area under the torque curve separately for each of the breakout stage, the running stage, and the ending stage. In some disclosed examples, the controller is further configured to determine the variance between the area under the torque curve and the area under the reference curve separately for each of the breakout stage, the running stage, and the ending stage. In some disclosed examples, the controller is further configured to determine whether the variance exceeds the variance threshold separately for each of the breakout stage, the running stage, and the ending stage. In some disclosed examples, the controller is further configured to generate the first control signal indicating that the electric actuator is healthy when it is determined that none of the respective variances of the breakout stage, the running stage, and the ending stage exceed the variance threshold. In some disclosed examples, the controller is further configured to generate a second control signal indicating that the electric actuator is unhealthy when it is determined that any of the respective variances of the breakout stage, the running stage, and the ending stage exceed the variance threshold.

In some disclosed examples, the controller is further configured to generate an information request control signal. In some disclosed examples, the information request control signal is to be transmitted over the network from the controller to the electric actuator to cause the electric actuator to deliver the torque curve data to the controller over the network. In some disclosed examples, the controller is further configured to generate the information request control signal based on at least one of a time-based schedule managed by the controller, an actuation-based schedule managed by the controller, or an input received by the controller from a user interface operatively coupled to the controller.

In some examples, a method for determining a health status of an electric actuator of a motor-operated valve is disclosed. In some disclosed examples, the method comprises obtaining, by executing one or more instructions with a controller operatively coupled to the electric actuator via a network, torque curve data over the network from the electric actuator. In some disclosed examples, the torque curve data is associated with actuation of an electric motor of the electric actuator. In some disclosed examples, the actuation is to cause a flow control member of the motor-operated valve to move. In some disclosed examples, the flow control member is mechanically coupled to the electric motor and is movable between an open position and a closed position. In some disclosed examples, the method further comprises determining, by executing one or more instructions with the controller, an area under a torque curve based on the torque curve data. In some disclosed examples, the method further comprises determining, by executing one or more instructions with the controller, a variance between the area under the torque curve and an area under a reference curve. In some disclosed examples, the method further comprises determining, by executing one or more instructions with the controller, whether the variance exceeds a variance threshold. In some disclosed examples, the method further comprises generating a first control signal indicating that the electric actuator is healthy when it is determined that the variance does not exceed the variance threshold.

In some disclosed examples, the method further comprises presenting, via a user interface operatively coupled to the controller, a first notification indicating that the electric actuator is healthy, the first notification being based on the first control signal.

In some disclosed examples, the method further comprises generating a second control signal indicating that the electric actuator is unhealthy when it is determined that the variance exceeds the variance threshold. In some disclosed examples, the method further comprises presenting, via the user interface, a second notification indicating that the electric actuator is unhealthy, the second notification being based on the second control signal.

In some disclosed examples, the torque curve is partitioned into a breakout stage, a running stage, and an ending stage. In some disclosed examples, the method further comprises determining the area under the torque curve separately for each of the breakout stage, the running stage, and the ending stage. In some disclosed examples, the method further comprises determining the variance between the area under the torque curve and the area under the reference curve separately for each of the breakout stage, the running stage, and the ending stage. In some disclosed examples, the method further comprises determining whether the variance exceeds the variance threshold separately for each of the breakout stage, the running stage, and the ending stage. In some disclosed examples, the method further comprises generating the first control signal indicating that the electric actuator is healthy when it is determined that none of the respective variances of the breakout stage, the running stage, and the ending stage exceed the variance threshold. In some disclosed examples, the method further comprises generating a second control signal indicating that the electric actuator is unhealthy when it is determined that any of the respective variances of the breakout stage, the running stage, and the ending stage exceed the variance threshold.

In some examples, a non-transitory computer-readable storage medium comprising instructions is disclosed. In some disclosed examples, the instructions, when executed, cause a controller to obtain torque curve data over a network from an electric actuator operatively coupled to the controller via the network. In some disclosed examples, the torque curve data is associated with actuation of an electric motor of the electric actuator. In some disclosed examples, the actuation is to cause a flow control member of the motor-operated valve to move. In some disclosed examples, the flow control member is mechanically coupled to the electric motor and is movable between an open position and a closed position. In some disclosed examples, the instructions, when executed, further cause the controller to determine an area under a torque curve based on the torque curve data. In some disclosed examples, the instructions, when executed, further cause the controller to determine a variance between the area under the torque curve and an area under a reference curve. In some disclosed examples, the instructions, when executed, further cause the controller to determine whether the variance exceeds a variance threshold. In some disclosed examples, the instructions, when executed, further cause the controller to generate a first control signal indicating that the electric actuator is healthy when it is determined that the variance does not exceed the variance threshold.

In some disclosed examples, the instructions, when executed, further cause a user interface operatively coupled to the controller to present a first notification indicating that the electric actuator is healthy, the first notification being based on the first control signal.

In some disclosed examples, the instructions, when executed, further cause the controller to generate a second control signal indicating that the electric actuator is unhealthy when it is determined that the variance exceeds the variance threshold. In some disclosed examples, the instructions, when executed, further cause the user interface to present a second notification indicating that the electric actuator is unhealthy, the second notification being based on the second control signal.

In some disclosed examples, the torque curve is partitioned into a breakout stage, a running stage, and an ending stage. In some disclosed examples, the instructions, when executed, further cause the controller to determine the area under the torque curve separately for each of the breakout stage, the running stage, and the ending stage. In some disclosed examples, the instructions, when executed, further cause the controller to determine the variance between the area under the torque curve and the area under the reference curve separately for each of the breakout stage, the running stage, and the ending stage. In some disclosed examples, the instructions, when executed, further cause the controller to determine whether the variance exceeds the variance threshold separately for each of the breakout stage, the running stage, and the ending stage. In some disclosed examples, the instructions, when executed, further cause the controller to generate the first control signal indicating that the electric actuator is healthy when it is determined that none of the respective variances of the breakout stage, the running stage, and the ending stage exceed the variance threshold. In some disclosed examples, the instructions, when executed, further cause the controller to generate a second control signal indicating that the electric actuator is unhealthy when it is determined that any of the respective variances of the breakout stage, the running stage, and the ending stage exceed the variance threshold.

Although certain example methods, apparatus, articles of manufacture and systems have been disclosed herein, the scope of coverage of this patent is not limited thereto. On the contrary, this patent covers all methods, apparatus, articles of manufacture and systems fairly falling within the scope of the claims of this patent.

What is claimed is:

1. An apparatus for determining a health status of an electric actuator of a motor-operated valve, the apparatus comprising:
a controller communicatively coupled to the electric actuator, the controller configured to:
obtain torque curve data generated by the electric actuator in association with actuation of an electric motor of the electric actuator, the torque curve data including torque data detected by a torque sensor of the electric actuator during the actuation and position data detected by a position sensor of the electric actuator during the actuation, the position data being synchronized to the torque data to provide torque of the electric motor as a function of position of a flow control member of the motor-operated valve mechanically coupled to the electric motor, the actuation to cause the flow control member to move between an open position and a closed position;
determine an area under a torque curve represented by the torque of the electric motor as the function of the position of the flow control member separately for each of a breakout stage, a running stage, and an ending stage of the torque curve;
determine a variance between the area under the torque curve and an area under a reference curve separately for each of the breakout stage, the running stage, and the ending stage;
determine whether the variance exceeds a variance threshold separately for each of the breakout stage, the running stage, and the ending stage; and
generate a first control signal indicating that the electric actuator is healthy when it is determined that none of the respective variances of the breakout stage, the running stage, and the ending stage exceed their respective variance thresholds.

2. The apparatus of claim 1, further comprising a user interface operatively coupled to the controller, the user interface configured to present a first notification indicating that the electric actuator is healthy, the first notification being based on the first control signal.

3. The apparatus of claim 2, wherein the controller is further configured to generate a second control signal indicating that the electric actuator is unhealthy when it is determined that any of respective variances of the breakout stage, the running stage, and the ending stage exceed their respective variance thresholds.

4. The apparatus of claim 3, wherein the user interface is further configured to present a second notification indicating that the electric actuator is unhealthy, the second notification being based on the second control signal.

5. The apparatus of claim 1, wherein the controller is further configured to generate an information request control signal, the information request control signal to be transmitted from the controller to the electric actuator to cause the electric actuator to deliver the torque curve data to the controller.

6. The apparatus of claim 5, wherein the controller is configured to generate the information request control signal based on at least one of a time-based schedule managed by the controller, an actuation-based schedule managed by the controller, or an input received by the controller from a user interface operatively coupled to the controller.

7. A method for determining a health status of an electric actuator of a motor-operated valve, the method comprising:
obtaining, by executing one or more instructions with a controller communicatively coupled to the electric actuator, torque curve data generated by the electric actuator in association with actuation of an electric motor of the electric actuator, the torque curve data including torque data detected by a torque sensor of the electric actuator during the actuation and position data detected by a position sensor of the electric actuator during the actuation, the position data being synchronized to the torque data to provide torque of the electric motor as a function of position of a flow control member of the motor-operated valve mechanically coupled to the electric motor, the actuation to cause the flow control member to move between an open position and a closed position;

determining, by executing one or more instructions with the controller, an area under a torque curve represented by the torque of the electric motor as the function of the position of the flow control member separately for each of a breakout stage, a running stage, and an ending stage of the torque curve;

determining, by executing one or more instructions with the controller, a variance between the area under the torque curve and an area under a reference curve separately for each of the breakout stage, the running stage, and the ending stage;

determining, by executing one or more instructions with the controller, whether the variance exceeds a variance threshold separately for each of the breakout stage, the running stage, and the ending stage; and generating a first control signal indicating that the electric actuator is healthy when it is determined that none of the respective variances of the breakout stage, the running stage, and the ending stage exceed their respective variance thresholds.

8. The method of claim 7, further comprising presenting, via a user interface operatively coupled to the controller, a first notification indicating that the electric actuator is healthy, the first notification being based on the first control signal.

9. The method of claim 8, further comprising generating a second control signal indicating that the electric actuator is unhealthy when it is determined that any of the respective variances of the breakout stage, the running stage, and the ending stage exceed their respective variance thresholds.

10. The method of claim 9, further comprising presenting, via the user interface, a second notification indicating that the electric actuator is unhealthy, the second notification being based on the second control signal.

11. The method of claim 7, further comprising generating an information request control signal, the information request control signal to be transmitted from the controller to the electric actuator to cause the electric actuator to cause the electric actuator to deliver the torque curve data to the controller.

12. The method of claim 11, further comprising generating the information request control signal based on at least one of a time-based schedule managed by the controller, an actuation-based schedule managed by the controller, or an input received by the controller from a user interface operatively coupled to the controller.

13. A non-transitory computer-readable storage medium comprising instructions that, when executed, cause a controller communicatively coupled to an electric actuator of a motor-operated valve to at least:

obtain torque curve data generated by the electric actuator in association with actuation of an electric motor of the electric actuator, the torque curve data including torque data detected by a torque sensor of the electric actuator during the actuation and position data detected by a position sensor of the electric actuator during the actuation, the position data being synchronized to the torque data to provide torque of the electric motor as a function of position of a flow control member of the motor-operated valve mechanically coupled to the electric motor, the actuation to cause the flow control member to move between an open position and a closed position;

determine an area under a torque curve represented by the torque of the electric motor as the function of the position of the flow control member separately for each of a breakout stage, a running stage, and an ending stage of the torque curve;

determine a variance between the area under the torque curve and an area under a reference curve separately for each of the breakout stage, the running stage, and the ending stage;

determine whether the variance exceeds a variance threshold separately for each of the breakout stage, the running stage, and the ending stage; and generate a first control signal indicating that the electric actuator is healthy when it is determined that none of the respective variances of the breakout stage, the running stage, and the ending stage exceed their respective variance thresholds.

14. The non-transitory computer-readable storage medium of claim 13, wherein the instructions, when executed, are to further cause a user interface operatively coupled to the controller to present a first notification indicating that the electric actuator is healthy, the first notification being based on the first control signal.

15. The non-transitory computer-readable storage medium of claim 14, wherein the instructions, when executed, are further to cause the controller to generate a second control signal indicating that the electric actuator is unhealthy when it is determined that any of the respective variances of the breakout stage, the running stage, and the ending stage exceed their respective variance thresholds.

16. The non-transitory computer-readable storage medium of claim 15, wherein the instructions, when executed, are further to cause the user interface to present a second notification indicating that the electric actuator is unhealthy, the second notification being based on the second control signal.

17. The non-transitory computer-readable storage medium of claim 13, wherein the instructions, when executed, are further to cause the controller to generate an information request control signal, the information request control signal to be transmitted from the controller to the electric actuator to cause the electric actuator to deliver the torque curve data to the controller.

18. The non-transitory computer-readable storage medium of claim 17, wherein the instructions, when executed, are further to cause the controller to generate the information request control signal based on at least one of a time-based schedule managed by the controller, an actuation-based schedule managed by the controller, or an input received by the controller from a user interface operatively coupled to the controller.

* * * * *

UNITED STATES PATENT AND TRADEMARK OFFICE
CERTIFICATE OF CORRECTION

PATENT NO. : 10,978,940 B2
APPLICATION NO. : 16/027014
DATED : April 13, 2021
INVENTOR(S) : Carlo Doglio Page 1 of 1

It is certified that error appears in the above-identified patent and that said Letters Patent is hereby corrected as shown below:

In the Claims

Column 33, Claim 11, Lines 43 and 44, replace "to the electric actuator to cause the electric actuator to cause the electric actuator to deliver" with --to the electric actuator to cause the electric actuator to deliver--

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*